United States Patent
Ukumori

(10) Patent No.: US 11,402,435 B1
(45) Date of Patent: Aug. 2, 2022

(54) ESTIMATION APPARATUS, ESTIMATION METHOD, AND COMPUTER PROGRAM

(71) Applicant: GS Yuasa International Ltd., Kyoto (JP)

(72) Inventor: Nan Ukumori, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 0 days.

(21) Appl. No.: 17/613,333

(22) PCT Filed: May 21, 2020

(86) PCT No.: PCT/JP2020/020137
§ 371 (c)(1),
(2) Date: Nov. 22, 2021

(87) PCT Pub. No.: WO2020/241449
PCT Pub. Date: Dec. 3, 2020

(30) Foreign Application Priority Data

May 24, 2019 (JP) ............................. JP2019-097997

(51) Int. Cl.
*G01R 31/392* (2019.01)
*H01M 10/48* (2006.01)
*H02J 7/00* (2006.01)
*G01R 31/3842* (2019.01)

(52) U.S. Cl.
CPC ....... *G01R 31/392* (2019.01); *G01R 31/3842* (2019.01); *H01M 10/48* (2013.01); *H02J 7/0047* (2013.01)

(58) Field of Classification Search
None
See application file for complete search history.

(56) References Cited

U.S. PATENT DOCUMENTS

| 2015/0236384 | A1 | 8/2015 | Nakayama et al. |
| 2016/0372935 | A1 | 12/2016 | Sakata et al. |
| 2017/0328957 | A1* | 11/2017 | Suzuki ................. G01R 31/392 |
| 2020/0057113 | A1 | 2/2020 | Ukumori |

FOREIGN PATENT DOCUMENTS

| JP | 2009-281955 A | 12/2009 |
| JP | 2012-149949 A | 8/2012 |
| JP | 2013-088156 A | 5/2013 |
| JP | 2015-153656 A | 8/2015 |
| JP | 6428957 B2 | 11/2018 |
| WO | WO-2016/135853 A1 | 9/2016 |
| WO | WO-2017/150416 | 9/2017 |

OTHER PUBLICATIONS

International Search Report for International Application No. PCT/JP2020/020137 (ISA/JP) with English translation dated Aug. 11, 2020 (5 pages).
Written Opinion for International Application No. PCT/JP2020/020137 (ISA/JP) dated Aug. 11, 2020 (3 pages).

* cited by examiner

*Primary Examiner* — Jas A Sanghera
(74) *Attorney, Agent, or Firm* — Alston & Bird LLP

(57) ABSTRACT

The estimation device 101 is provided with: an acquisition unit 201 for acquiring time-series data on the SOC of a power storage device; a decomposition unit 202 for decomposing a waveform indicating a fluctuation in the SOC in the time-series data into waveform components of a plurality of frequency regions; and an estimation unit 204 for estimating the deterioration of the power storage device on the basis of the intensities of the waveform components and a deterioration coefficient.

11 Claims, 18 Drawing Sheets

Fig. 18

| No. | Graph after fourier transform | Degradation coefficient k |
|---|---|---|
| 1 | | 0.1925 |
| 2 | | 0.2348 |
| ⋮ | ⋮ | ⋮ |

ESTIMATION APPARATUS, ESTIMATION METHOD, AND COMPUTER PROGRAM

CROSS REFERENCE TO RELATED APPLICATIONS

This application is a national stage application, filed under 35 U. S.C. § 371, of International Application No. PCT/JP2020/020137, filed May 21, 2020, which international application claims priority to and the benefit of Japanese Patent Application No. 2019-097997, filed May 24, 2019; the contents of both of which as are hereby incorporated by reference in their entireties.

BACKGROUND

Technical Field

The present invention relates to an estimation apparatus, an estimation method, and a computer program for estimating degradation of an energy storage device.

Description of Related Art

An energy storage device, which can store electric energy and supply energy as a power source when needed, has been used. The energy storage device has been applied to portable equipment, power supply apparatuses, transportation equipment including automobiles and trains, equipment for industries including aviation, space, and construction, and the like. It is important to constantly grasp the storage capacity of the energy storage device so that the stored energy can be used as much as necessary when needed. It is known that the energy storage device is mainly chemically degraded in accordance with the time and use frequency. Hence the energy that can be utilized decreases in accordance with the time and the frequency of use. It is important to grasp the degradation state of the energy storage device in order to use energy as much as necessary when needed. A technique for estimating degradation of an energy storage device has been developed so far.

There is a demand for a technique capable of satisfactorily estimating a state of health (SOH) even when a state of charge (SOC) of an energy storage device varies variously.

As disclosed in Japanese Patent No. 6428957, the present inventor has found that a degradation value is large when a variation range of an SOC around a predetermined SOC is large and that the degradation value changes depending on the center SOC even when the variation range of the SOC is the same. An estimation apparatus for estimating the degradation of the energy storage device based on the variation magnitude of the SOC and the center SOC has been developed. In the estimation apparatus of Japanese Patent No. 6428957, the degradation value is estimated to increase in accordance with the variation magnitude of the SOC.

BRIEF SUMMARY

In the conventional method, the estimation accuracy of the degradation of the energy storage device may not be sufficient. Even when the variation range of the SOC is small, the SOC may be degraded when the charge is performed at a high rate. There is a demand for better estimation of degradation even for a complicated variation pattern of the SOC and a variation pattern having a small variation range of the SOC.

An object of the present invention is to provide an estimation apparatus, an estimation method, and a computer program capable of accurately estimating degradation of an energy storage device.

An estimation apparatus according to one aspect of the present invention includes: an acquisition unit that acquires time-series data of a state of charge (SOC) in an energy storage device; a decomposition unit that decomposes a waveform of a variation in the SOC in the time-series data into a frequency component; and an estimation unit that estimates degradation of the energy storage device based on the frequency component.

An estimation method according to one aspect of the present invention includes: acquiring time-series data of a state of charge (SOC) in an energy storage device; decomposing a waveform of a variation in the SOC in the time-series data into a frequency component; and estimating degradation of the energy storage device based on the frequency component.

A computer program according to one aspect of the present invention causes a computer to execute processing of acquiring time-series data of a state of charge (SOC) in an energy storage device, decomposing a waveform of a variation in the SOC in the time-series data into a frequency component, and estimating degradation of the energy storage device based on the frequency component.

In the present invention, it is possible to accurately estimate the degradation of the energy storage device.

BRIEF DESCRIPTION OF THE FIGURES

FIG. 18 is an explanatory diagram illustrating an example of a record layout of teacher data DB.

DETAILED DESCRIPTION OF VARIOUS EMBODIMENTS

Summary of Present Embodiment

Figure 1:
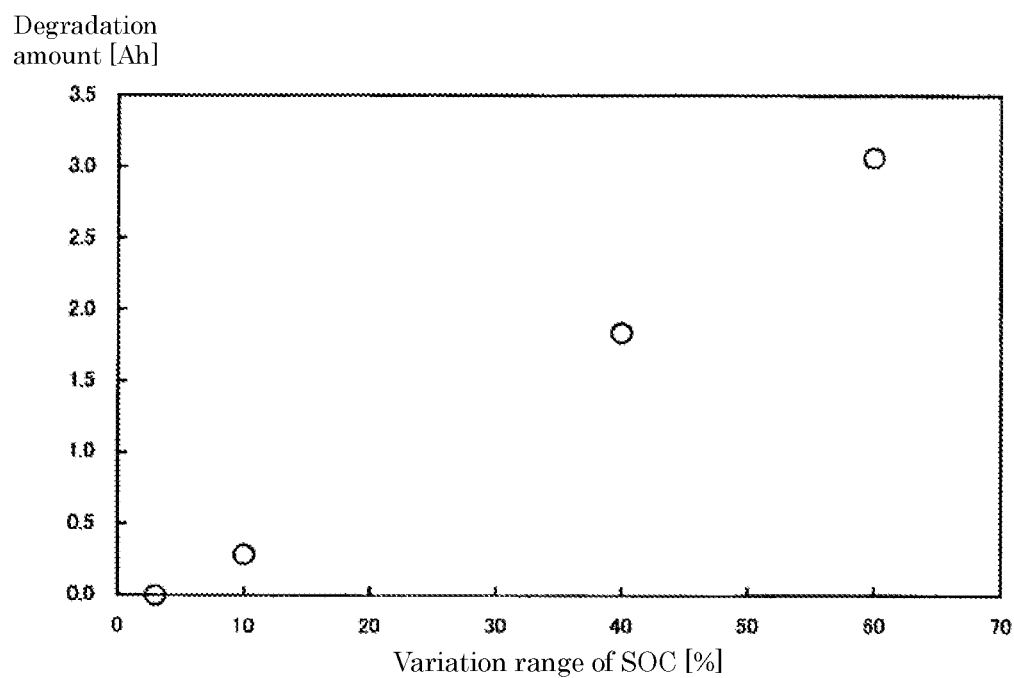
FIG. 1 is a view illustrating an example of a change in a degradation value of an energy storage device due to energization with respect to a variation range of an SOC.

An estimation apparatus according to an embodiment includes: an acquisition unit that acquires time-series data of a state of charge (SOC) in an energy storage device; a decomposition unit that decomposes a waveform of a variation in the SOC in the time-series data into a frequency component; and an estimation unit that estimates degradation of the energy storage device based on the frequency component.

With the above configuration, since the waveform of the variation in the SOC is decomposed into frequency components, a waveform having a large variation but a long period (variation time) and a waveform having a small variation but a short period can also be detected. The waveform having a large variation but a long period becomes a waveform component (frequency component) having a high intensity (spectral intensity, or amplitude spectrum in the case of Fourier transform) and a low frequency. The waveform having a small variation but a short period becomes a waveform component having a low intensity and a high frequency. When the period is very long even though the variation is large, the degradation is small. When the period is very short even though the variation is small, the degradation is large. In a case where the energy storage device is a lithium ion secondary battery, when the quick charge is performed with high frequency on the high SOC side, lithium electrodeposition may occur in a negative electrode, and degradation is large. Although the waveform of the variation in the SOC varies depending on the characteristics of the energy storage device and the way of use by a user, with the above configuration, any waveform can be detected to satisfactorily estimate the degradation of the energy storage device.

In the estimation apparatus described above, the acquisition unit may acquire time-series data of an SOC in a predetermined period, and the decomposition unit may process a function of a temporal change of a variation in the SOC in the predetermined period.

With the above configuration, a temporal change of the SOC variation in the predetermined period is acquired, and the temporal change of the SOC variation is analyzed. The degradation is not estimated sequentially from time to time from the data of the SOC variation, but the degradation is estimated in a batch processing manner by acquiring a temporal change of the SOC variation in a predetermined period. It is possible to satisfactorily estimate the degradation by analyzing what kind of SOC change contributes to the degradation in the temporal change of the SOC variation range in a certain time width.

In the estimation apparatus described above, the decomposition unit may decompose the waveform of the variation in the SOC in the time-series data into waveform components in a plurality of frequency domains, and the estimation unit may estimate the degradation based on an intensity and a degradation coefficient of each of the waveform components.

With the above configuration, the degradation is estimated based on the variation magnitude of the SOC and the degradation coefficient. It is possible to satisfactorily estimate the degradation based on the actual complicated variation pattern while considering that the amount of change in the SOH increases corresponding to the variation range of the SOC and also considering the waveform having a very small variation range.

The estimation apparatus described above may include a specification unit that specifies a degradation coefficient based on the waveform component, and the estimation unit may estimate the degradation based on the degradation coefficient specified by the specification unit.

With the above configuration, the degradation coefficient corresponding to the variation range of the SOC and the SOC center and used to calculate the degradation is specified based on the waveform component. The degradation coefficient can be specified using the distribution of the waveform component in the frequency domain, the intensity and the frequency of the waveform component having a high peak, and the like, and the degradation can be estimated satisfactorily and easily.

In the estimation apparatus described above, the specification unit may specify the degradation coefficient based on a relationship among an intensity, a frequency and a degradation coefficient of a waveform component.

With the above configuration, the relationship among the intensity, the frequency and the degradation coefficient of the waveform component is obtained in advance, and the degradation coefficient can be specified based on this relationship to satisfactorily and easily estimate the degradation.

In the estimation apparatus described above, the specification unit may weight a waveform component having a high intensity as compared to a waveform component having a low intensity and specify a degradation coefficient.

Weighting is performed based on the distribution of the waveform component in the frequency domain, the intensity and the frequency of the waveform component having a high peak, and the like, and the degradation coefficient is specified based on the amplitude and the frequency of the waveform component obtained by the weighting, so that the degradation can be estimated satisfactorily.

In the estimation apparatus described above, the specification unit may input the waveform component acquired by the decomposition unit to a learning model and specify the degradation coefficient, the learning model outputting a degradation coefficient when receiving an input of a waveform component.

With the above configuration, the degradation coefficient is specified in consideration of the waveform component having a small spectral intensity and a large frequency, and the degradation can be estimated satisfactorily.

The estimation method according to an embodiment includes: acquiring time-series data of a state of charge (SOC) in an energy storage device; decomposing a waveform of a variation in the SOC in the time-series data into a frequency component; and estimating degradation of the energy storage device based on the frequency component. The waveform of the variation in the SOC in the time-series data may be decomposed into waveform components in a plurality of frequency domains, and the degradation of the energy storage device may be estimated based on the intensity and the degradation coefficient of each waveform component.

With the above configuration, since the waveform of the variation in the SOC is decomposed, a waveform having a large variation but a long period, and a waveform having a small variation but a short period can also be detected. Any waveform can be estimated in accordance with the characteristics of the energy storage device and the way of use by the user, thereby satisfactorily estimating the degradation of the energy storage device.

A computer program according to an embodiment causes a computer to execute processing of acquiring time-series data of a state of charge (SOC) in an energy storage device, decomposing a waveform of a variation in the SOC in the time-series data into a frequency component, and estimating degradation of the energy storage device based on the frequency component. The computer may be caused to execute processing of decomposing the waveform of the variation in the SOC in the time-series data into waveform components in a plurality of frequency domains, and estimating the degradation of the energy storage device based on an intensity and a degradation coefficient of each of the waveform components.

FIG. 1 is a view illustrating an example of a change in the amount of degradation of an energy storage device due to energization with respect to a variation range of an SOC. In FIG. 1, the vertical axis represents the difference between the amount of degradation when a predetermined amount of electricity is energized and the amount of degradation in an SOC variation range of 3%, and the horizontal axis represents the variation range of the SOC.

In FIG. 1, the amount of degradation due to energization after the charge and discharge are repeated a predetermined number of times such the center SOC is 60% is plotted with respect to the variation range of the SOC.

As illustrated in FIG. 1, the present inventor has found that the amount of degradation due to energization changes when the variation range of the SOC is different even when the center SOC is the same. It has been found that the degradation due to energization increases in accordance with the variation magnitude of the SOC.

The mechanism of this phenomenon has not yet been fully figured out. The present inventor considers that as the variation magnitude of the SOC increases, expansion (at the time of charge) and contraction (at the time of discharge) of the negative electrode become more remarkable, so that a solid electrolyte interphase (SEI) film formed on the surface of the negative electrode is partially destroyed, and as a result, the amount of degradation of the energy storage device due to energization increases.

Figure 2:
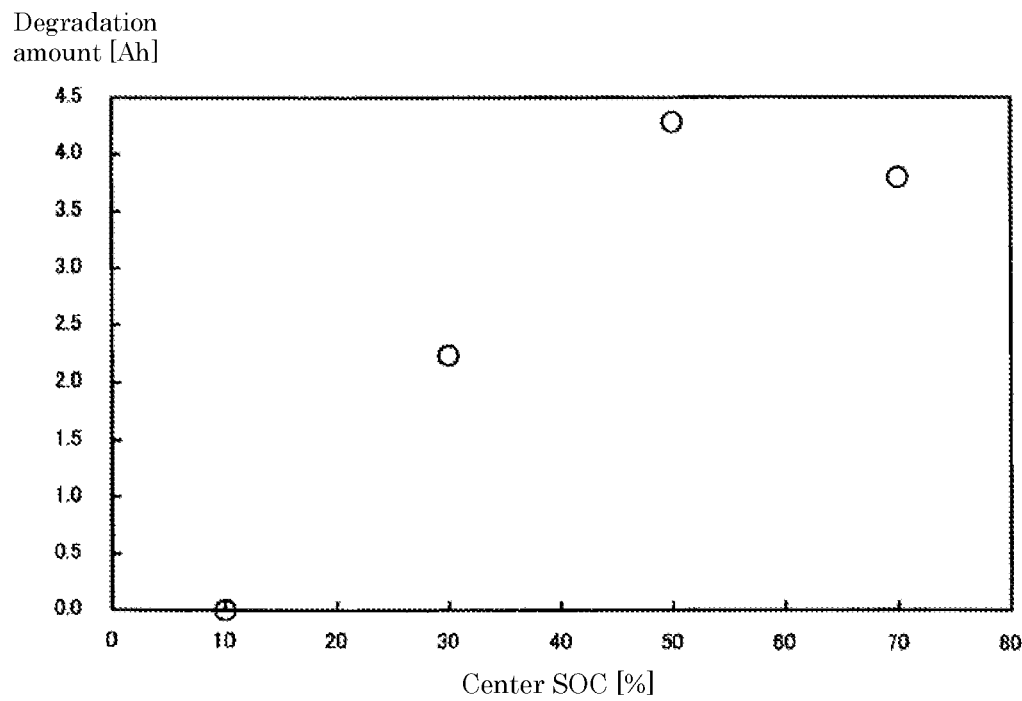
FIG. 2 is a view illustrating an example of a change in a degradation value due to energization of the energy storage device with respect to a center SOC.

FIG. 2 is a view illustrating an example of a change in the amount of degradation of the energy storage device due to energization with respect to the center SOC. In FIG. 2, the vertical axis represents the difference between the amount of degradation when the predetermined amount of electricity is energized and the amount of degradation at the center SOC of 10%, and the horizontal axis represents the center SOC which is the center of the variation in the SOC. Here, the center SOC refers to the center of the variation in the SOC in the time-series data of the SOC.

In FIG. 2, the amount of degradation due to energization after the charge and discharge are repeated a predetermined number of times such that the variation range of the SOC is 10% is plotted with respect to the center SOC.

Here, the charge-discharge operation will be described with an example. Repeating the charge and discharge such that the center SOC is 10% and the variation range of the SOC is 10% means repeating the charge and discharge such that the SOC reciprocates between 0% and 20%. It can be seen that the amount of degradation greatly varies depending on the center SOC even when the amount of variation is the same.

As described above, the SOH needs to be estimated in consideration of not only the total amount of variation in the SOC but also the variation range of the SOC and the center SOC. As disclosed in Japanese Patent No. 6428957, the inventor of the present application has paid attention to the SOC variation range and developed an estimation apparatus that estimates degradation of an energy storage device based on the variation magnitude of the SOC and the center SOC. As described above, in Japanese Patent No. 6428957, the degradation value is increased in accordance with the variation magnitude of the SOC to increase the estimation accuracy. It is desirable to detect a waveform having a very small SOC variation range and to estimate the degradation value more satisfactorily for a complicated variation pattern of the SOC.

The waveform of the variation in the SOC in a predetermined acquisition period is decomposed into waveform components in a plurality of frequency domains, and the degradation of the energy storage device is estimated based on the intensity and the degradation coefficient of each of the waveform components. The present inventor has found that the degradation can be estimated more satisfactorily by decomposing the waveform into waveform components to simulate an actual complicated variation pattern and detect waveforms of a plurality of variation ranges including a waveform having a very small variation range while considering that the amount of change in the SOH increases corresponding to the variation range of the SOC, and the present inventor has completed the present invention.

The present invention can be rephrased as follows. The inventor has found that the accuracy of the degradation estimation may be improved by acquiring a temporal change of the SOC variation in a certain time width (fixed period)

and analyzing the temporal change of the SOC variation. That is, the present invention is a method in which the degradation is not estimated sequentially from time to time from the SOC variation data, but the degradation is estimated in a batch processing manner by acquiring a temporal change of the SOC variation in a certain time width (fixed period). A point of the present invention is to estimate the degradation by analyzing what kind of SOC change contributes to the degradation in the temporal change of the SOC variation range in a certain time width. Therefore, in the temporal change of the SOC variation range in a certain fixed period, the temporal change of the SOC variation is expressed by another variable, and the temporal change of the original SOC variation range is expressed by another function. As this method, a frequency transformation method is common, and a widely known method includes Fourier transform. In general, fast Fourier transform (FFT) is performed. When the temporal change of the SOC variation in a certain time width (fixed period) is expressed by another function, it is best to express the SOC variation by a plurality of (many) functions. However, the analysis (control) takes time, and hence the SOC variation may be expressed only by a function having the largest contribution to the temporal change.

Alternatively, averaging processing may be performed on the temporal change of the SOC variation in a certain time width (fixed period).

Figure 3:
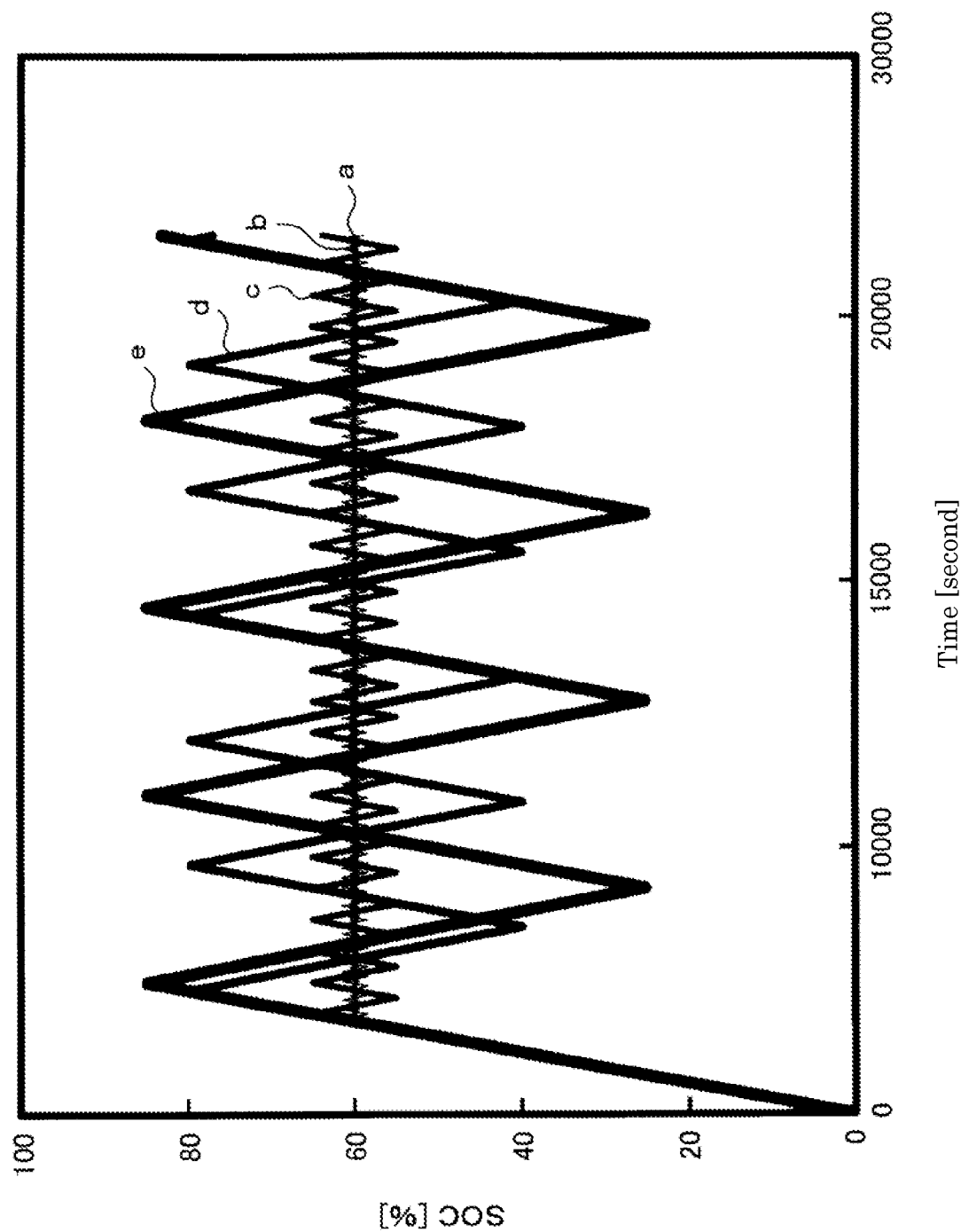
FIG. 3 is a graph illustrating the relationship between the time and the SOC when the SOC is varied by $\Delta 0.5\%$, $\Delta 1.5\%$, $\Delta 5\%$, $\Delta 20\%$, and $\Delta 30\%$.

FIG. 3 is a graph illustrating the relationship between the time and the SOC when the SOC is varied by Δ0.5%, Δ1.5%, Δ5%, Δ20%, and Δ30%. The horizontal axis represents time [sec], and the vertical axis represents SOC [%]. Graphs of Δ0.5%, Δ1.5%, Δ5%, Δ20%, and Δ30% are indicated by a, b, c, d, and e, respectively.

FIGS. 4A to 4E are graphs obtained by performing the Fourier transform on the waveform of FIG. 3 and decomposing the waveform into waveform components in a plurality of frequency domains. The horizontal axis represents frequency [Hz], and the vertical axis represents amplitude (amplitude spectrum) [%]. By the Fourier transform, a complicated waveform can be decomposed into a plurality of sin waveforms, and the obtained f(ω) can be indicated by a graph with an angular frequency on the horizontal axis and the magnitude (amplitude) of a sin wave of each angular frequency ω on the vertical axis. In FIG. 4, the angular frequency is replaced with the frequency. The variation range of the waveform in FIG. 3 is related to the amplitude of the waveform component in FIG. 4, and the period of the waveform in FIG. 3 corresponds to the frequency centroid of each of some waveform components in FIG. 4. By the Fourier transform, frequency transform is performed on the complicated waveform of FIG. 3 into f(ω), and the contribution of f(ω) is expressed as spectral intensity (peak height or peak area). By acquiring the time-series data of the SOC in a short acquisition period, it is possible to estimate the time-series data in a long period. In many cases, the use pattern of the energy storage device of the user is almost fixed.

The graphs in FIGS. 4A to 4E correspond to waveforms of a, b, c, d, e in FIG. 3, respectively.

Figure 4A:
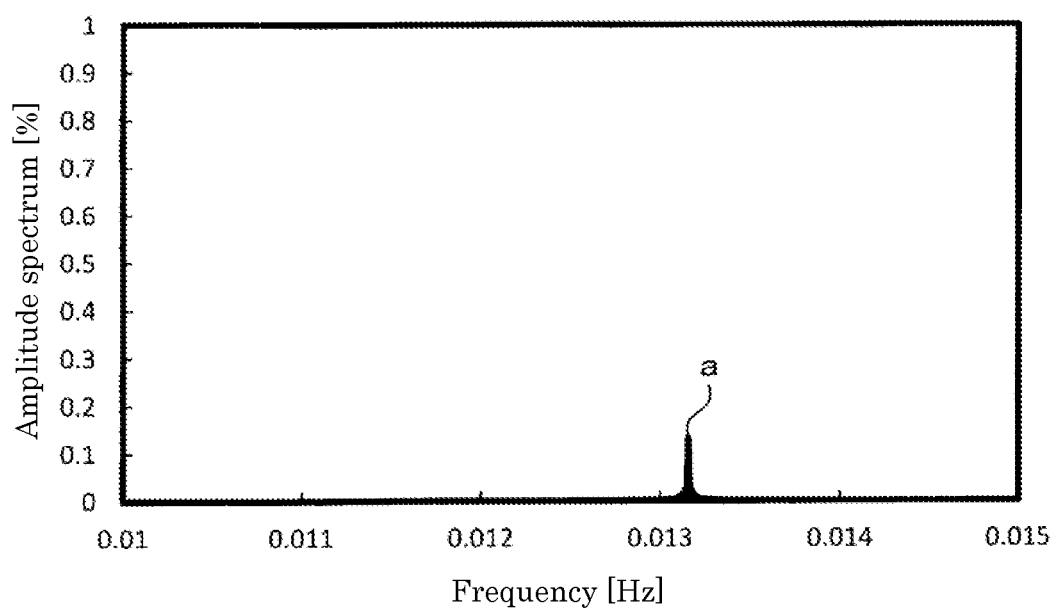
FIG. 4A is a graph obtained by performing Fourier transform on the waveform of FIG. 3 and decomposing the waveform into the waveform components in the plurality of frequency domains.
Figure 4B:
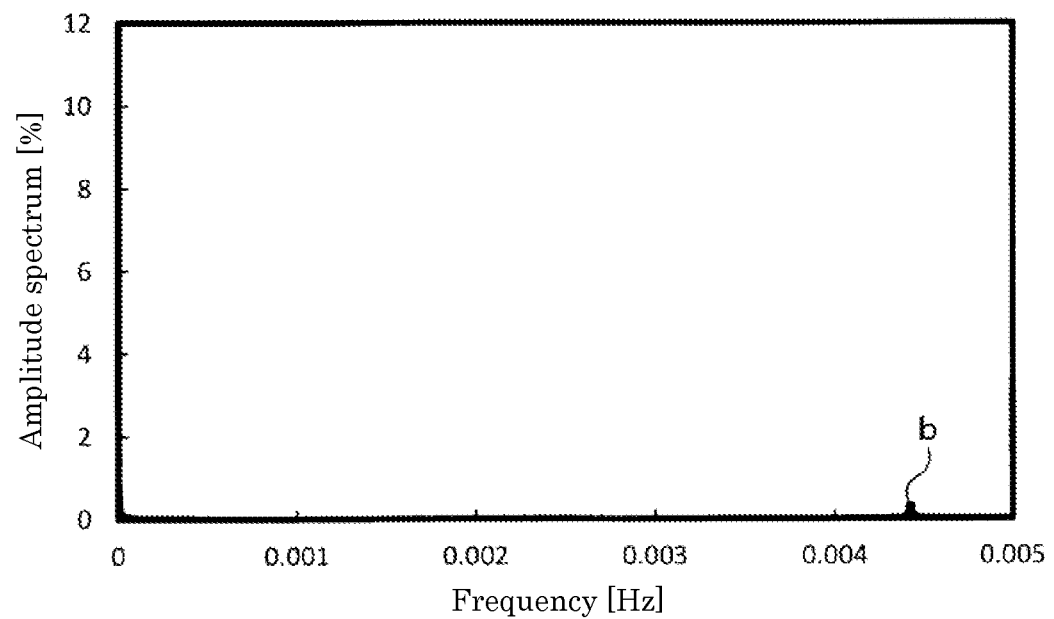
FIG. 4B is a graph obtained by performing the Fourier transform on the waveform of FIG. 3 and decomposing the waveform into the waveform components in the plurality of frequency domains.
Figure 4C:
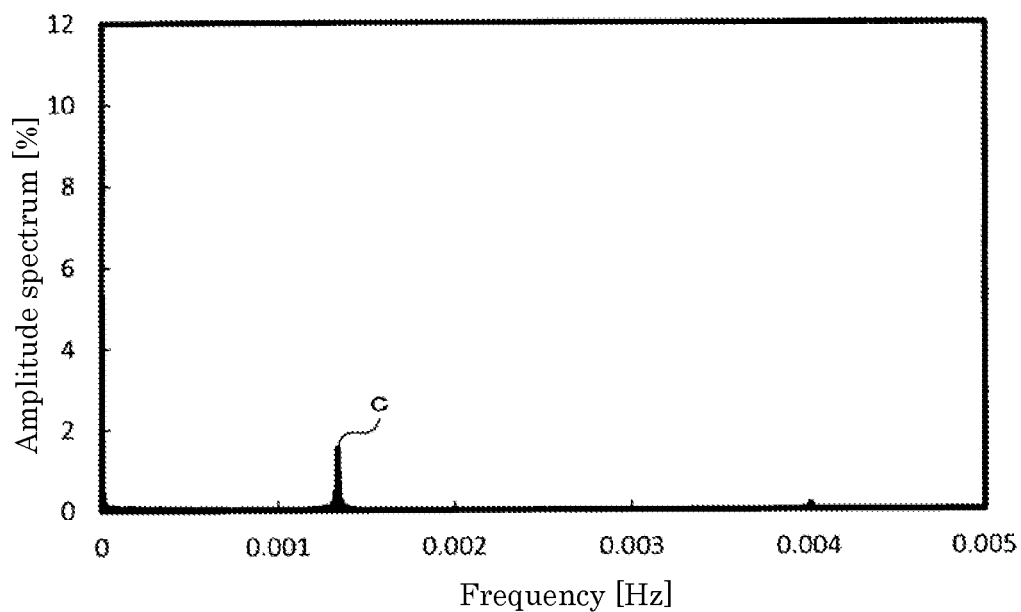
FIG. 4C is a graph obtained by performing the Fourier transform on the waveform of FIG. 3 and decomposing the waveform into the waveform components in the plurality of frequency domains.
Figure 4D:
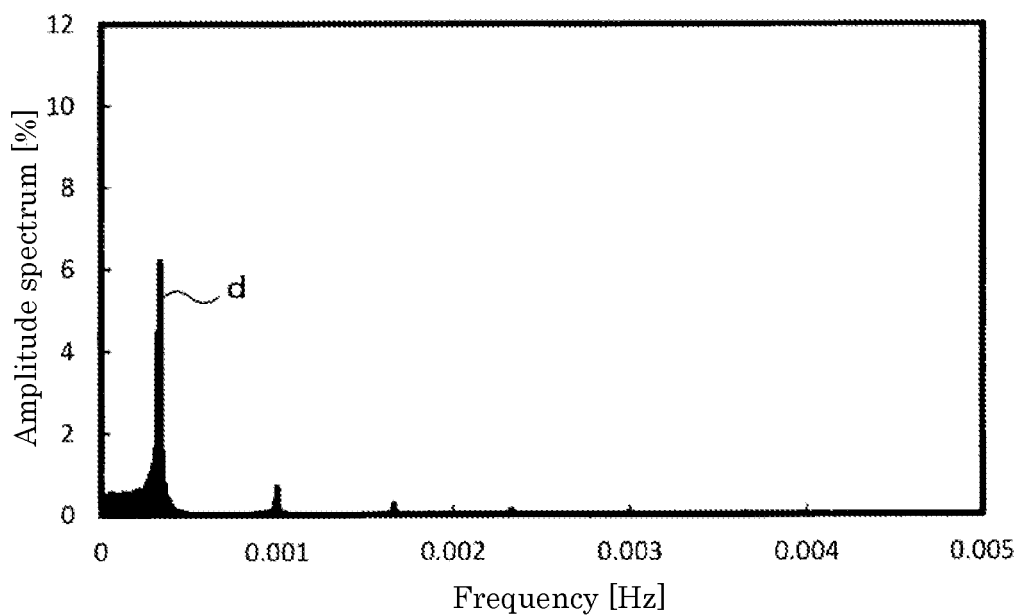
FIG. 4D is a graph obtained by performing the Fourier transform on the waveform of FIG. 3 and decomposing the waveform into the waveform components in the plurality of frequency domains.
Figure 4E:
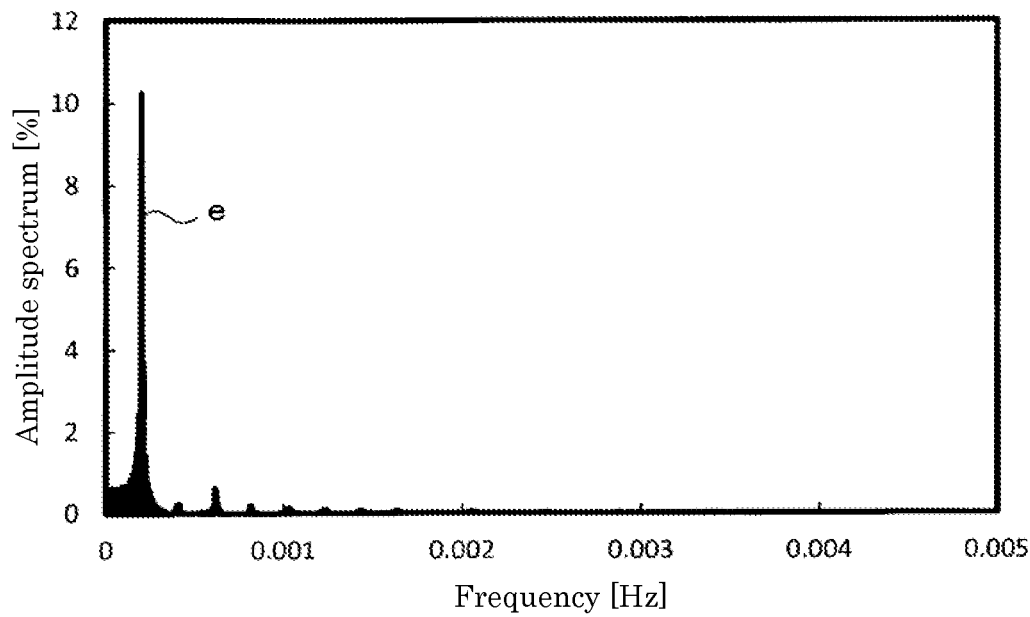
FIG. 4E is a graph obtained by performing the Fourier transform on the waveform of FIG. 3 and decomposing the waveform into the waveform components in the plurality of frequency domains.

As illustrated in FIGS. 4A to 4E, the waveforms of a, b, c, d, e in FIG. 3 are decomposed into the waveform components in the plurality of frequency domains. The peak component of the waveform component corresponding to the waveform of a has a frequency of about 0.013 and an amplitude of about 0.133 and is illustrated in FIG. 4A. The peak component of the waveform component of FIG. 4E corresponding to the waveform e of Δ30% of FIG. 3 has a large amplitude because of a large variation in the waveform e of FIG. 3, and has a small frequency because of a long period. The peak component of the waveform component of FIG. 4B corresponding to the waveform b of Δ1.5% has a small amplitude because of a small variation in the waveform b of FIG. 3, and has a large frequency because of a short period.

Figure 5:
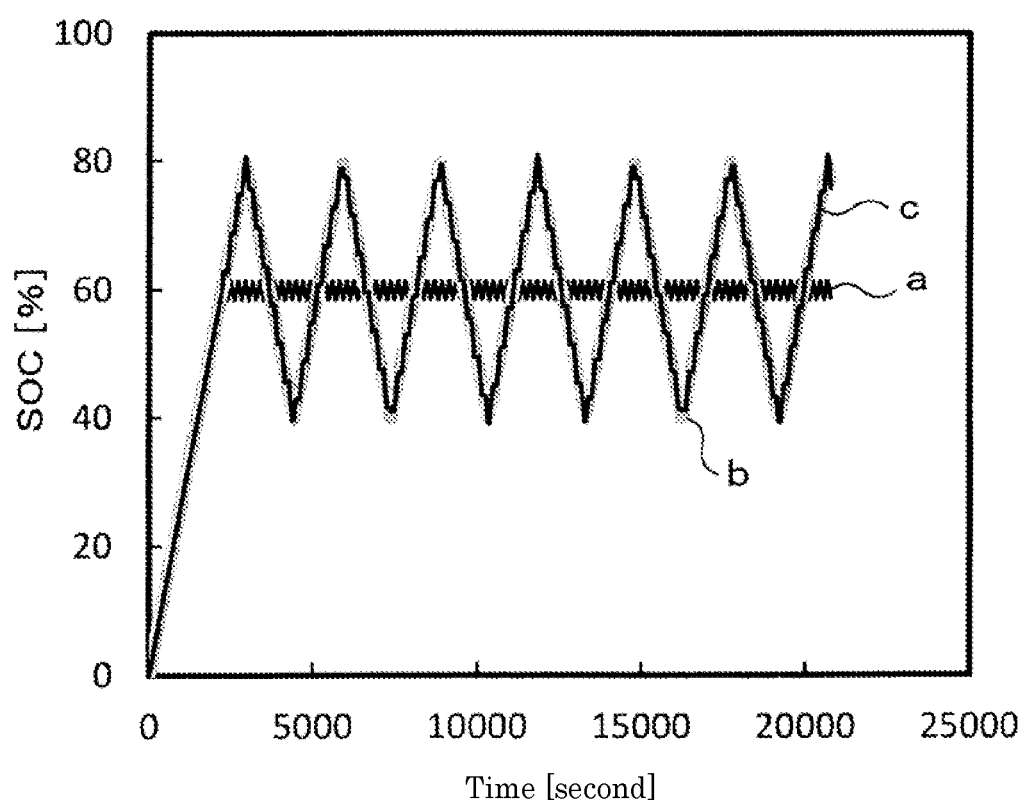
FIG. 5 is a graph illustrating the relationship between the time and the SOC when the SOC is varied by $\Delta 1.5\%$ and $\Delta 20\%$.

FIG. 5 is a graph illustrating the relationship between the time and the SOC when the SOC is varied by Δ1.5% and Δ20%. The horizontal axis represents time [sec], and the vertical axis represents SOC [%]. Graphs of Δ1.5%, Δ20% and a graph obtained by combining the graph of Δ1.5% with the graph of Δ20% are indicated by a, b, and c.

Figure 6:
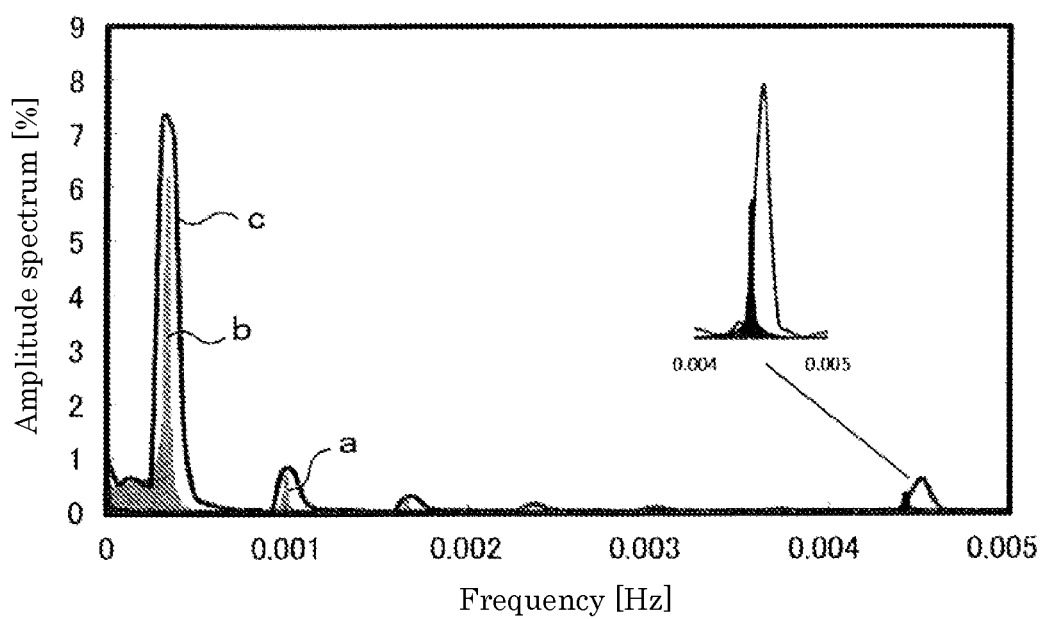
FIG. 6 is a graph obtained by performing the Fourier transform on the waveform of FIG. 5 and decomposing the waveform into waveform components in a plurality of frequency domains.

FIG. 6 is a graph obtained by performing the Fourier transform on the waveform of FIG. 5 and decomposing the waveform into waveform components in a plurality of frequency domains. The horizontal axis represents frequency (Hz), and the vertical axis represents amplitude. From FIG. 6, most of the waveform components correspond to the waveform b of Δ20%, and these waveform components include the waveform component corresponding to the waveform a of Δ1.5%. The degradation can be estimated based on a waveform component having a large amplitude. That is, it is possible to estimate the degradation by performing weighting based on a waveform component having a large amplitude.

The estimation method according to the present embodiment includes: acquiring time-series data of the SOC in the energy storage device; and decomposing a waveform of a variation in the SOC in the time-series data into waveform components in a plurality of frequency domains. Weighting is performed on a waveform component having a large amplitude as compared to a waveform component having a low intensity (small amplitude). The relationship among the amplitude, the frequency, and the degradation coefficient is obtained in advance. A degradation coefficient k is specified based on the amplitude and the frequency of the focused waveform component obtained by performing the weighting. A degradation value (cycle degradation) is calculated by the following formula (1) based on the specified degradation coefficient k.

$$\text{Degradation value} = k \times \sqrt{t} \tag{1}$$

Here, t is an elapsed time. The degradation value increases, for example, in accordance with the root law. Increasing in accordance with the root law means that an increment per unit time of the degradation value gradually decreases with the lapse of time (cf. FIG. 15).

First Embodiment

Hereinafter, the present invention will be specifically described with reference to the drawings illustrating embodiments.

Figure 7:
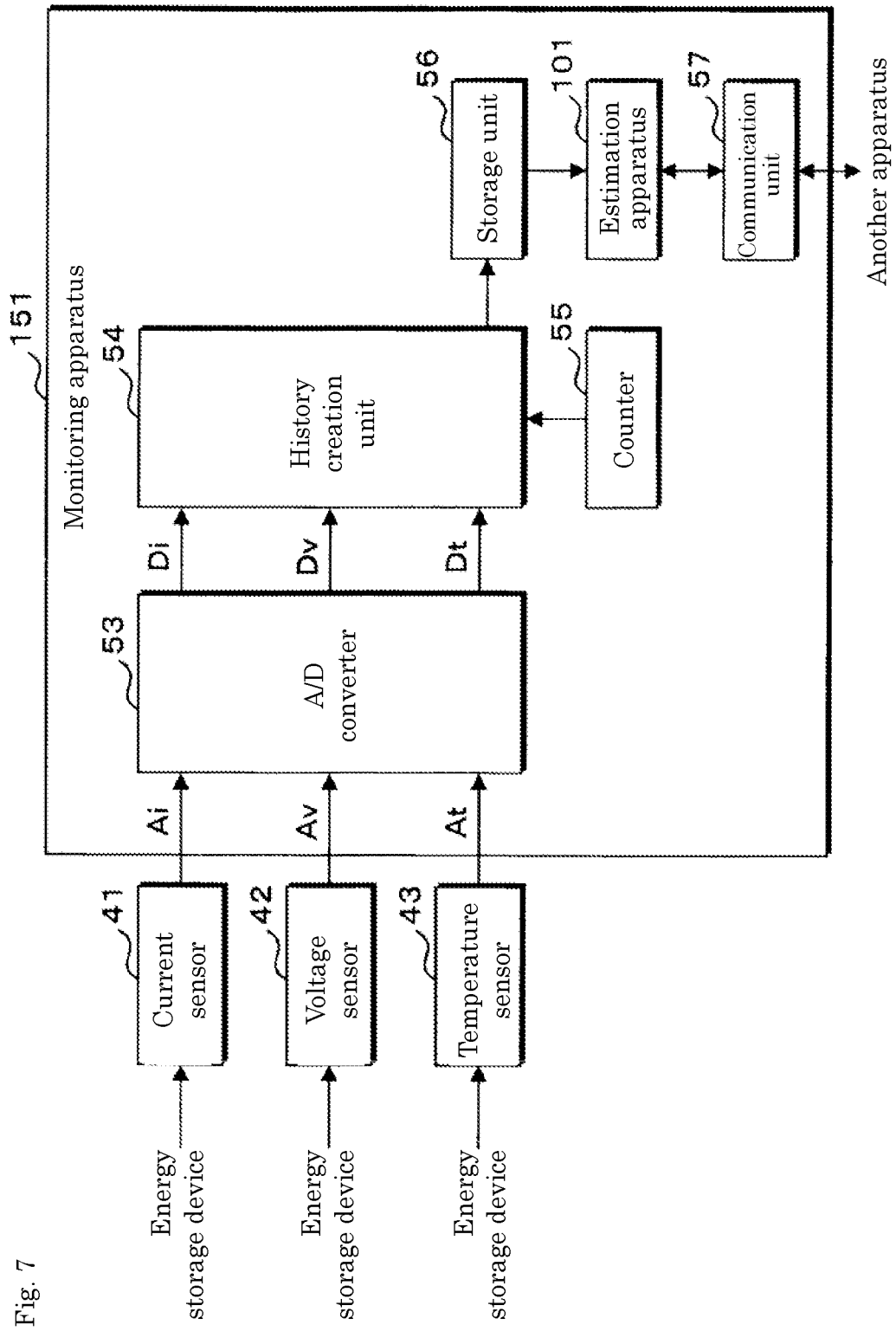
FIG. 7 is a diagram illustrating a configuration of a monitoring apparatus.

FIG. 7 is a diagram illustrating a configuration of a monitoring apparatus 151. The monitoring apparatus 151 includes an analog-to-digital (A/D) converter 53, a history creation unit 54, a counter 55, a storage unit 56, a communication unit 57, and an estimation apparatus 101. A current sensor 41, a voltage sensor 42, and a temperature sensor 43 are connected to the monitoring apparatus 151.

Some of the components included in the monitoring apparatus 151 may be disposed away from other components. For example, the estimation apparatus 101 may be disposed at a remote place and communicate with the communication unit 57. Further, a server disposed at a remote location and connected to a network may function as the estimation apparatus 101.

The monitoring apparatus 151 monitors the degradation of the energy storage device (lithium ion secondary battery in the present embodiment) to be monitored. The monitoring apparatus 151 may set one battery cell as a monitoring target or may set a plurality of battery cells connected in series or in parallel (an assembled battery) as the monitoring target. The monitoring apparatus 151 may constitute an energy storage apparatus (battery pack) together with the assembled battery.

The energy storage device to be monitored is not limited to a nonaqueous electrolyte secondary battery such as a lithium ion secondary battery but may be another electrochemical cell in which a hypothesis, an algorithm, and a mathematical model to be described later are compatible. Hereinafter, the energy storage device to be monitored will also be simply referred to as a battery.

The counter 55 in the monitoring apparatus 151 counts clock pulses generated by an oscillation circuit or the like using a crystal oscillator and holds the counted value. The count value may indicate the current time.

The current sensor 41 measures a current with which the energy storage device and a current discharged from the energy storage device, and outputs an analog signal Ai indicating the measurement result to the A/D converter 53.

The voltage sensor 42 measures a voltage between a positive electrode and a negative electrode in the energy storage device and outputs an analog signal Av indicating the measurement result to the A/D converter 53.

The temperature sensor 43 measures a temperature T at a predetermined portion of the energy storage device and outputs an analog signal At indicating the measurement result to the A/D converter 53.

For example, the A/D converter 53 converts the analog signals Ai, Av, At respectively received from the current sensor 41, the voltage sensor 42, and the temperature sensor 43 at predetermined sampling time intervals into digital signals Di, Dv, Dt.

The history creation unit 54 stores the count value of the counter 55 at the sampling time and the digital signals Di, Dv, Dt into the storage unit 56. The storage unit 56 stores the sampling time, the current value, the voltage value, and the temperature T for each sampling time. The storage unit 56 stores the number of charge-discharge cycles, and the number of charge-discharge cycles is updated each time the charge and discharge are repeated.

The communication unit 57 may communicate with another apparatus such as a main controller (main electronic control unit (ECU)) in a vehicle, a personal computer, a server, a smartphone, or a terminal for maintenance of an energy storage device.

When receiving a command to estimate the degradation state of the energy storage device from another apparatus, for example, the communication unit 57 outputs the received command to estimate the degradation state of the energy storage device to the estimation apparatus 101.

Figure 8:
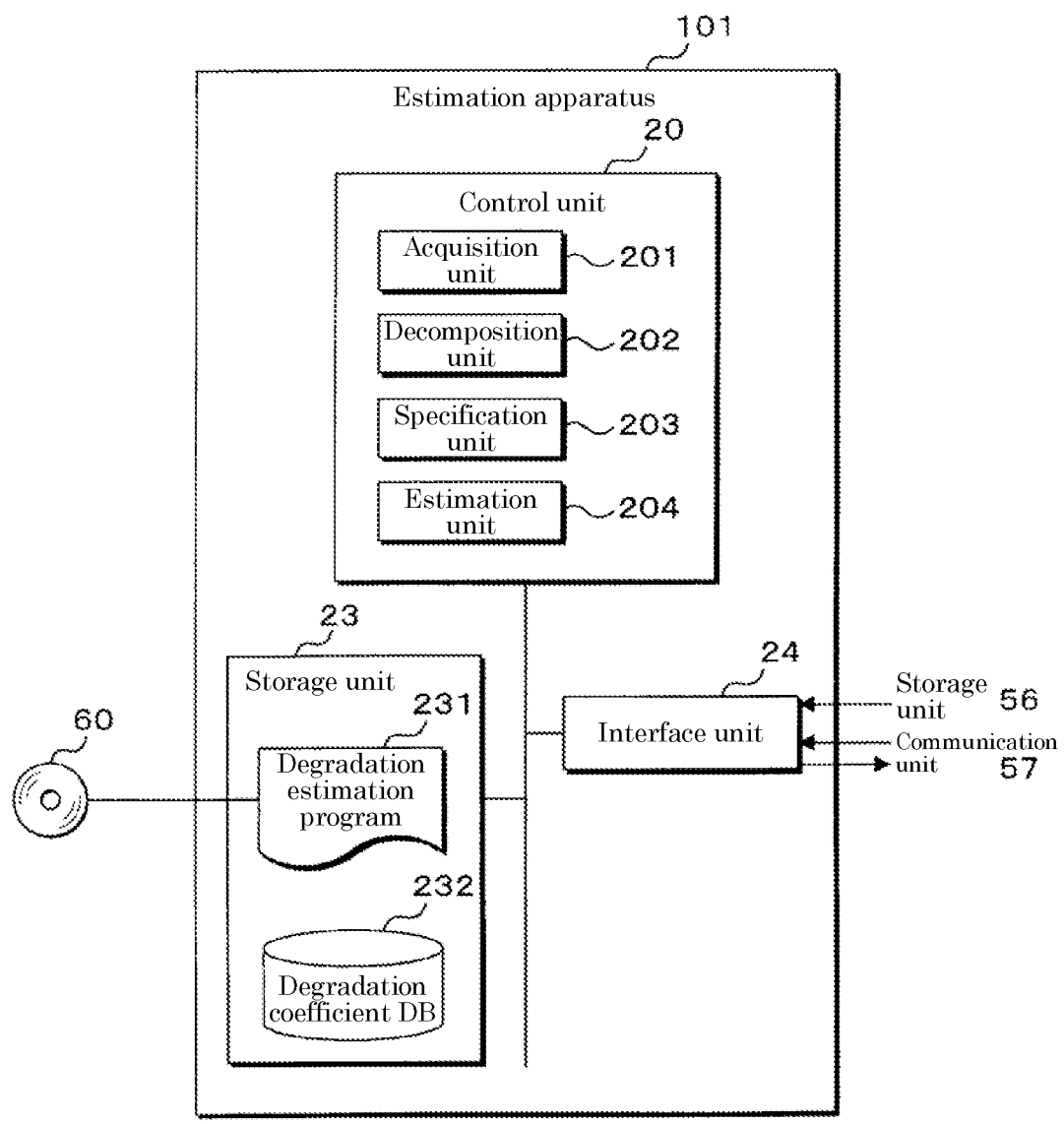
FIG. 8 is a diagram illustrating a configuration of an estimation apparatus.

FIG. 8 is a diagram illustrating the configuration of the estimation apparatus 101.

Referring to FIG. 8, the estimation apparatus 101 includes a control unit 20, a storage unit 23, and an interface unit 24. The interface unit 24 includes, for example, a local area network (LAN) interface, a universal serial bus (USB) interface, and the like and communicates with another apparatus such as the monitoring apparatus 151 in a wired or wireless manner.

A signal line or a terminal from the estimation apparatus 101 to the communication unit 57 may function as an output unit that outputs an estimation result or the like. The communication unit 57 may function as the output unit.

When different input data is input to the estimation apparatus 101, a different output is obtained from the output unit. When a different SOC variation range (and/or the center SOC) is input to the estimation apparatus 101, the output unit may output a different output (e.g., a voltage value and a duty ratio).

A display unit (or notification unit) that displays an output result may be connected to the output unit. The output from the output unit may be displayed on the display unit (or notification unit) via the communication unit 57.

The storage unit 23 stores a degradation estimation program 231 for executing degradation estimation processing to be described later. The degradation estimation program 231 is provided in a state of being stored in a computer-readable recording medium 60, such as a compact disc read-only memory (CD-ROM), a digital versatile disc read-only memory (DVD-ROM), and a USB memory, and is stored into the storage unit 23 by being installed into the estimation apparatus 101. The degradation estimation program 231 may be acquired from an external computer (not illustrated) connected to a communication network and stored into the storage unit 23.

The storage unit 23 stores a degradation coefficient DB 232 necessary for the degradation estimation processing. For example, the degradation coefficient DB 232 stores the relationship among the amplitude and the frequency of the waveform component and the degradation coefficient for each of the center SOC, the temperature, and the acquisition period in which the time-series data of the SOC is acquired. In a case where any of the center SOC, the temperature, and the acquisition period is constant, for example, in a case where the acquisition period is constant, it is not necessary to store the relationship for each acquisition period. For example, for each temperature T and each SOC center, the temporal changes of the degradation value when the SOC is varied by $\Delta 0.5\%$, $\Delta 1.5\%$, $\Delta 5\%$, $\Delta 20\%$, $\Delta 30\%$ are measured by a preliminary test. The degradation coefficient k is calculated based on the measurement result of the test.

The control unit 20 is made up of, for example, a central processing unit (CPU), a ROM, a random-access memory (RAM), and the like and controls the operation of the estimation apparatus 101 by executing a computer program such as the degradation estimation program 231 read from the storage unit 23.

The control unit 20 functions as a processing unit that executes the degradation estimation processing by reading and executing the degradation estimation program 231.

The control unit 20 includes an acquisition unit 201, a decomposition unit 202, a specification unit 203, and an estimation unit 204.

The acquisition unit 201 acquires the time-series data of the SOC in the energy storage device. More specifically, when receiving the estimation command from the communication unit 57, the acquisition unit 201 acquires each sampling time and the current value, the voltage value, and the temperature T at each sampling time from the storage unit 56 in the monitoring apparatus 151 via the interface unit 24 in accordance with the received estimation command. The sampling interval and the acquisition period in which sampling is performed are determined in accordance with the characteristics and usage of the energy storage device. When the sampling interval is short, the waveform may be broken. When the variation range is large, and the period is long, it is necessary to lengthen the acquisition period.

In this manner, the acquisition unit 201 acquires data measured after the start of use of the energy storage device from the storage unit 56.

Alternatively, the acquisition unit 201 may acquire data from a data file.

The acquisition unit 201 ensures a storage area for storing data on the sampling time, the SOC, and the temperature.

For example, the acquisition unit 201 calculates the amount of electricity supplied to the energy storage device by aggregating the current value at each sampling time and converts the calculated amount of electricity into the amount of change in the SOC. Then, the acquisition unit 201 calculates the SOC at each sampling time based on the conversion result. The acquisition unit 201 may correct the SOC by using, for example, a measurement value of an open-circuit voltage.

The decomposition unit 202 performs the Fourier transform on the waveform of the variation in the SOC in the time-series data of the SOC acquired by the acquisition unit 201 and decomposes the waveform into waveform components in a plurality of frequency domains.

The specification unit 203 weights a waveform component having a large amplitude as compared to a waveform component having a small amplitude. The weighting is performed based on the peak height of each waveform component, the area of each waveform component, or the like. The specification unit 203 specifies the degradation coefficient k based on the amplitude and the frequency of the focused waveform component obtained by performing the weighting.

The estimation unit 204 calculates a degradation value, for example, cycle degradation (the amount of reduction in capacity), by the above formula (1) based on the degradation coefficient k specified by the specification unit 203.

The estimation unit 204 may transmit estimation result information indicating the calculated degradation value to another apparatus via the communication unit 57 as a response to the estimation command.

For example, the estimation unit 204 can estimate the degradation of the energy storage device due to energization on the basis of the change in the state of the coated film on the electrode based on the variation magnitude of the SOC. The growth rate of the SEI film decreases as the SEI film is formed, but when the variation in the SOC is large, and the SEI film is partially broken, the growth rate of the SEI film increases, and the degradation value increases. In the present embodiment, a variation waveform having a large variation range is considered by weighting, and a variation waveform having a small variation range is also detected by the Fourier transform, so that the accuracy in the estimation of the degradation is high.

The monitoring apparatus 151 or the estimation apparatus 101 in the monitoring apparatus 151 includes the control unit 20, and the control unit 20 reads from the storage unit 23 the degradation estimation program 231 including some or all of steps in a flowchart shown below and executes the program.

Figure 9:
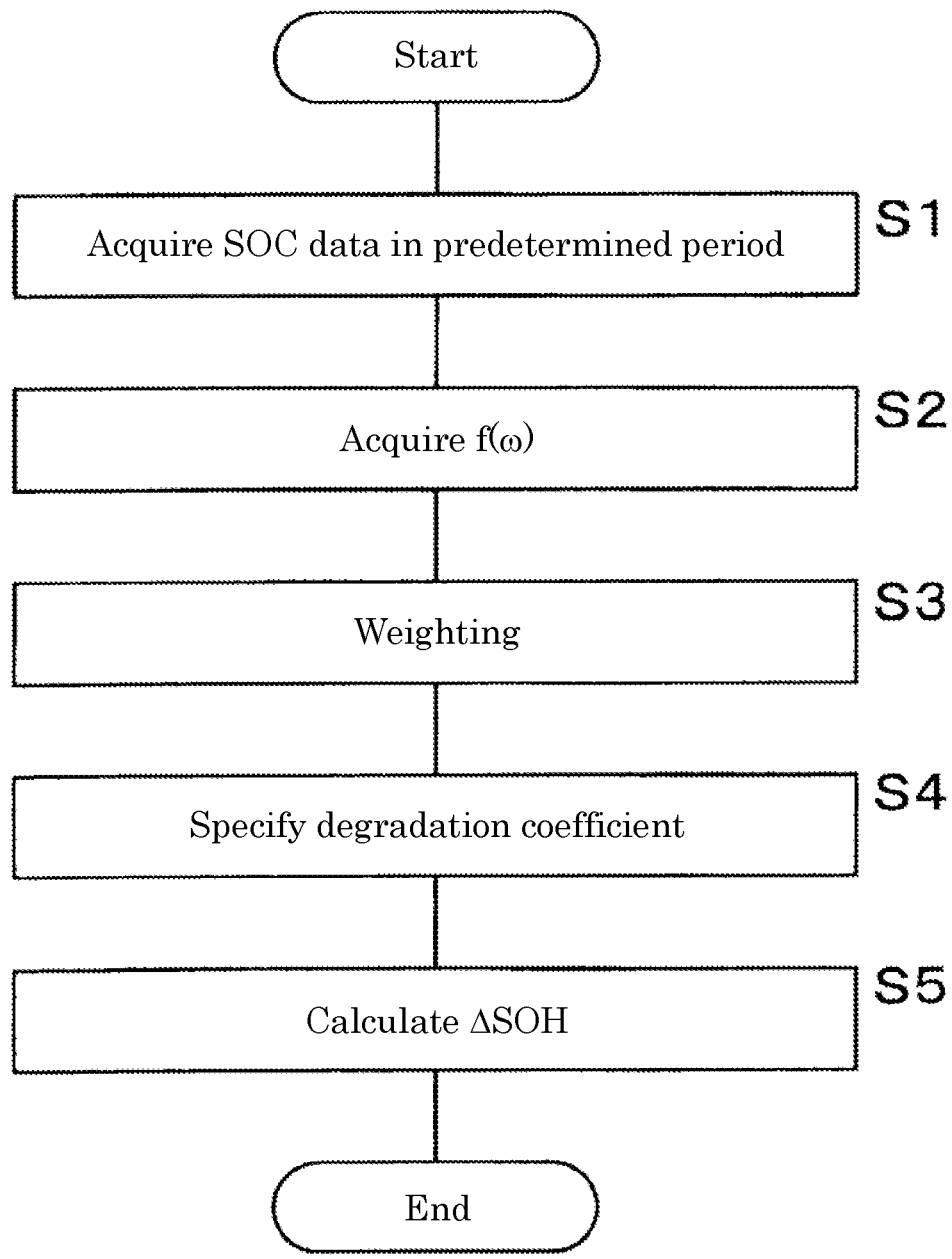
FIG. 9 is a flowchart illustrating a procedure for processing in which the estimation apparatus calculates a degradation value based on time-series data.

FIG. 9 is a flowchart defining an operation procedure when the estimation apparatus estimates the degradation of the energy storage device.

Referring to FIG. 9, a situation is assumed in which the control unit 20 of the estimation apparatus 101 receives an estimation command from another apparatus. Hereinafter, a case will be described where, for example, the center SOC is 60%, and the charge and discharge are repeated such that the SOC reciprocates between 30% and 90%.

First, the control unit 20 acquires variation data of the SOC in a predetermined period (S1).

The control unit 20 performs Fourier transform on the waveform of the variation in the SOC to acquire $f(\omega)$ and transform $f(\omega)$ into a function $f(f)$ of the frequency (S2).

The control unit 20 performs weighting (S3). The weighting is performed based on the peak height of each waveform component, the area (integrated value) of each waveform component, or the like.

The control unit 20 specifies the degradation coefficient k (S4). The control unit 20 reads the degradation coefficient DB 232 and acquires the relationship among the amplitude, the frequency, and the degradation coefficient in accordance with the center SOC, the temperature, and the acquisition period. The control unit 20 specifies a degradation coefficient kr from the relationship among the amplitude, the frequency, and the degradation coefficient based on the amplitude and the frequency of the focused waveform component obtained by performing the weighting.

The control unit 20 calculates ΔSOH by the above formula (1) based on the specified degradation coefficient k (S5) and ends the processing.

Hereinafter, a specific description will be given.

Figure 10:
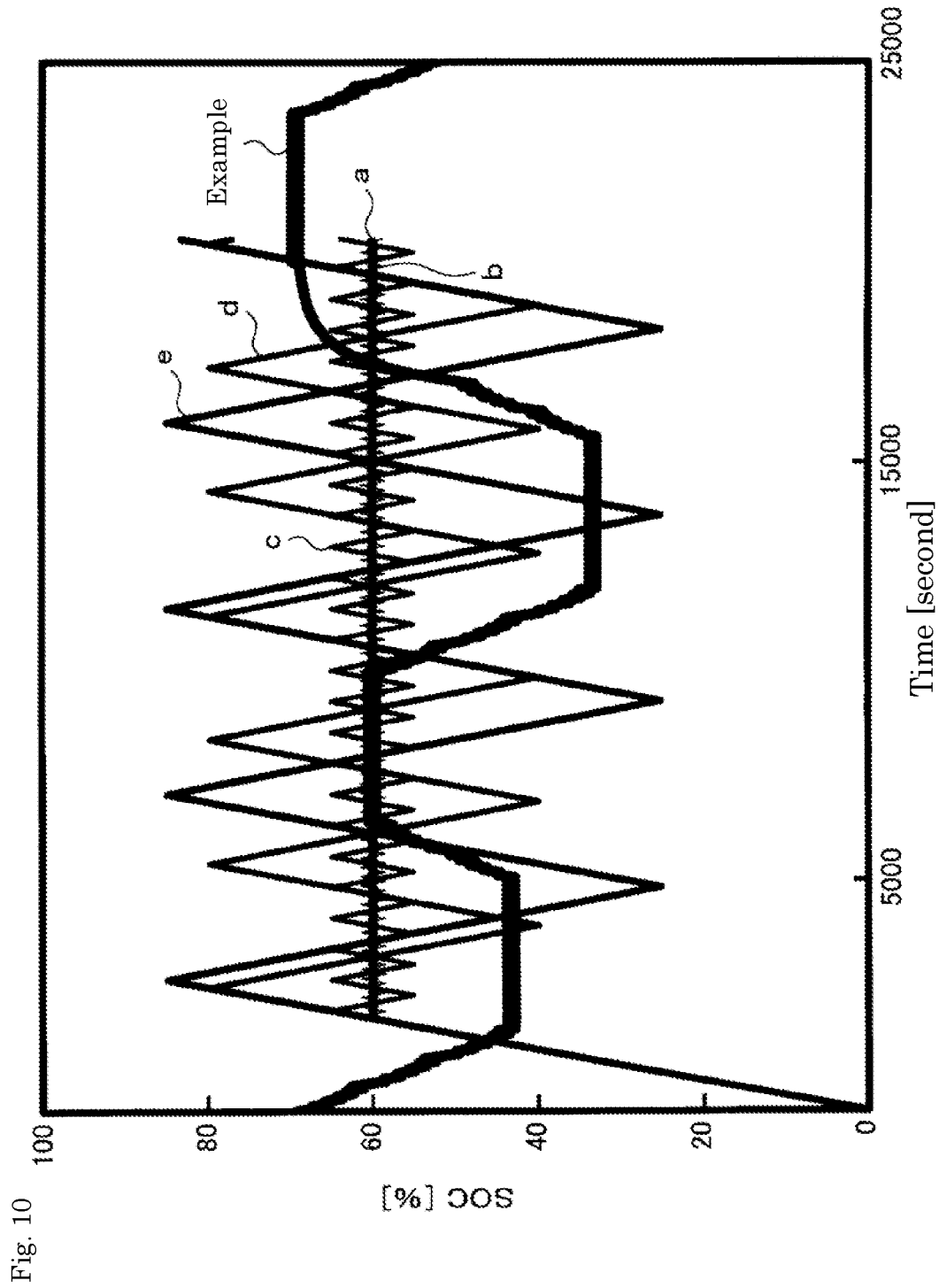
FIG. 10 is a graph illustrating the relationship between the time and the SOC when the SOC is varied by Δ0.5%, Δ1.5%, Δ5%, Δ20%, and Δ30%.

FIG. 10 is a graph illustrating the relationship between the time and the SOC when the SOC is varied by Δ0.5%, Δ1.5%, Δ5%, Δ20%, and Δ30%. The horizontal axis represents time [sec], and the vertical axis represents SOC [%]. In FIG. 10, graphs when the SOC is varied by Δ0.5%, Δ1.5%, Δ5%, Δ20%, and Δ30% are indicated by a, b, c, d, and e. FIG. 10 also illustrates a variation in the SOC when the energy storage device is actually used (an example).

Figure 11:
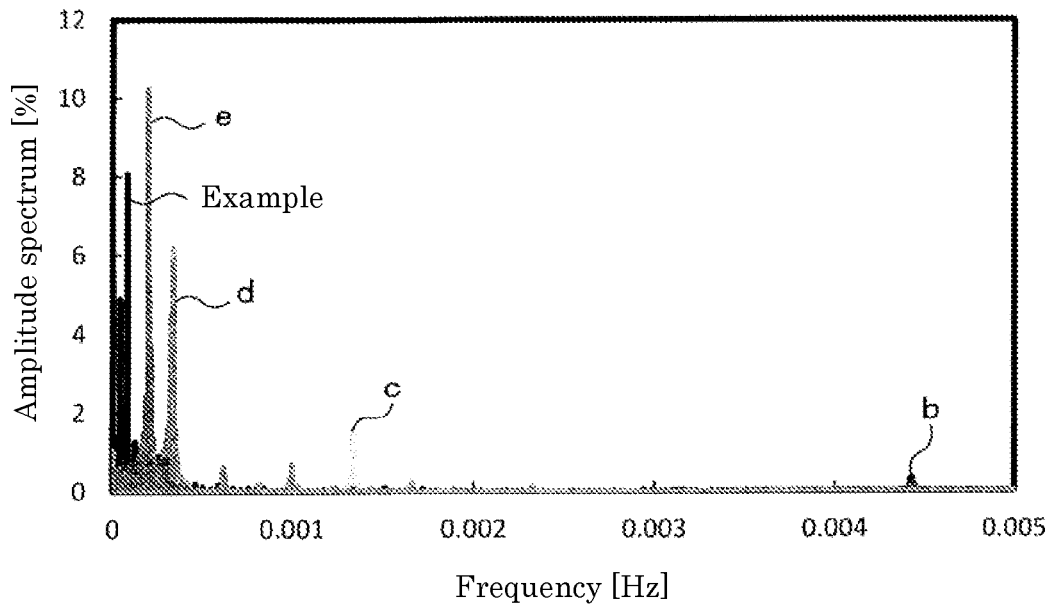
FIG. 11 is a graph obtained by performing the Fourier transform on the waveform of FIG. 10 and decomposing the waveform into waveform components in a plurality of frequency domains.

FIG. 11 is a graph obtained by performing the Fourier transform on the waveform of FIG. 10 and decomposing the waveform into waveform components in a plurality of frequency domains. The horizontal axis represents frequency [Hz], and the vertical axis represents amplitude spectrum [%].

Similarly to FIG. 6, the waveform components corresponding to the waveforms of b, c, d, e of FIG. 10 are illustrated, and a waveform component obtained by decomposing the waveform of the example is also illustrated. The peak component of the waveform component corresponding to the waveform of a of FIG. 10 has a frequency of about 0.013 and an amplitude of about 0.133and is not illustrated in FIG. 10.

The degradation coefficient k of each ΔSOC is obtained by experiment as described above.

Figure 12:
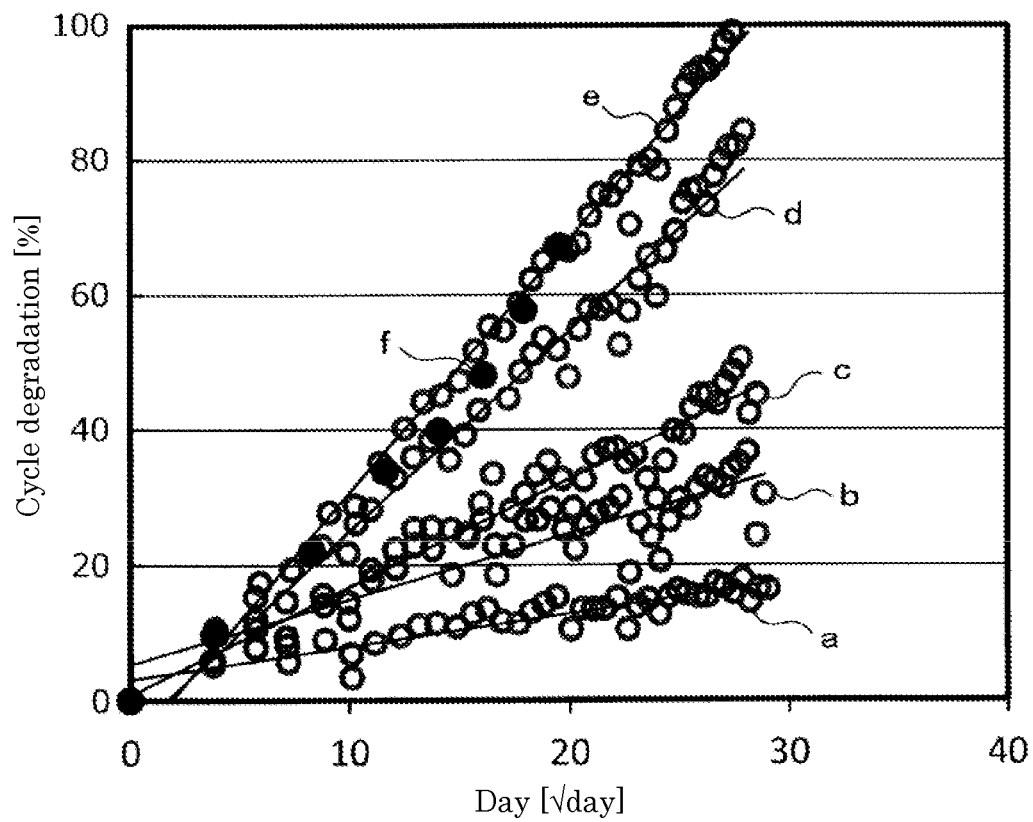
FIG. 12 is a graph illustrating the relationship between the number of days and cycle degradation when the SOC is varied by Δ0.5%, Δ1.5%, Δ5%, Δ20%, Δ30%, and Δ100%.
Figure 13:
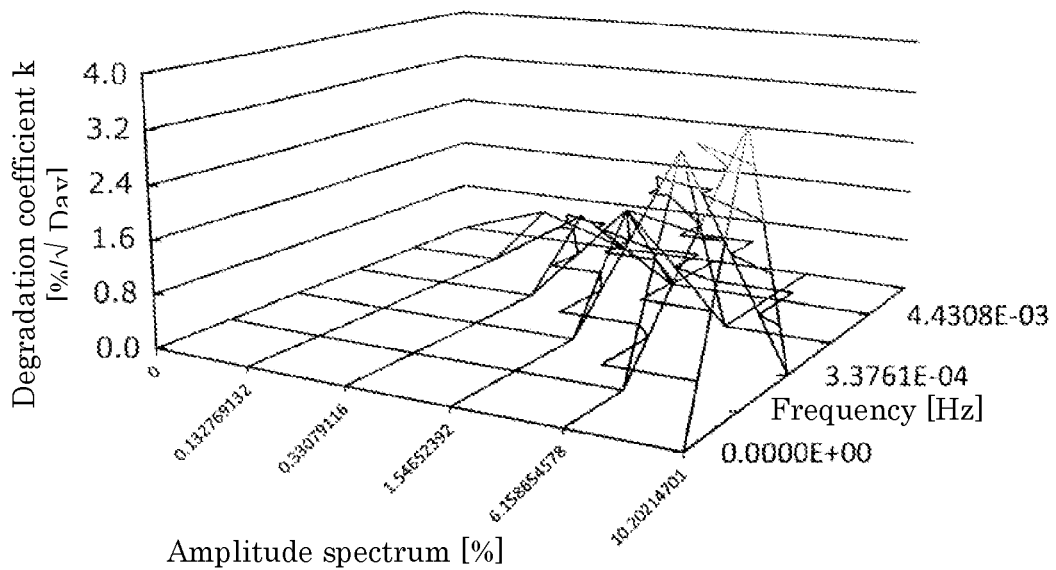
FIG. 13 is a graph illustrating the relationship among an amplitude spectrum, a frequency, and a degradation coefficient.
Figure 14:
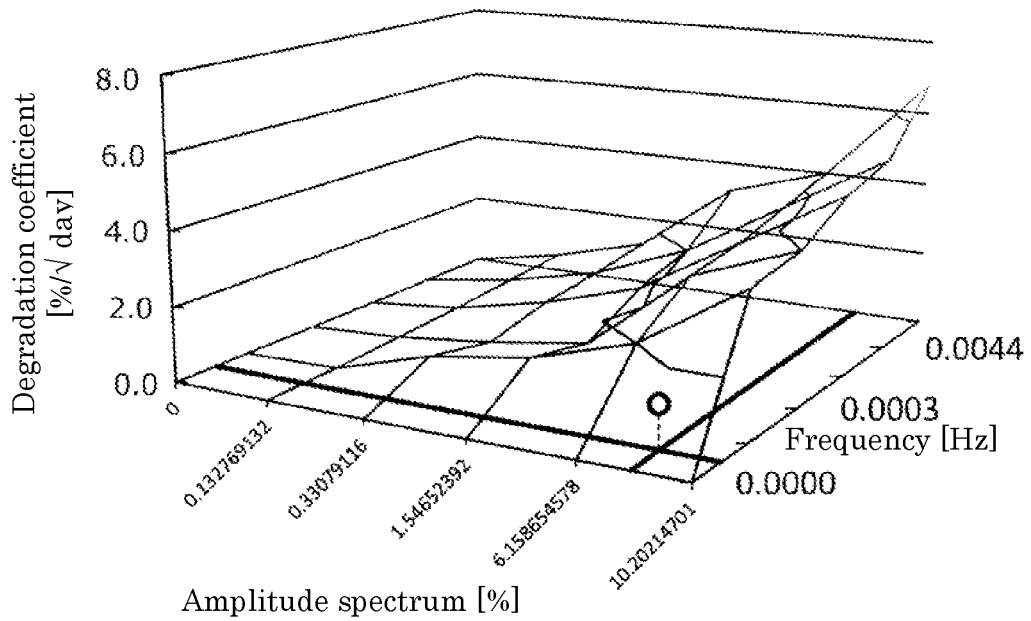
FIG. 14 is a graph illustrating the relationship among an amplitude spectrum, a frequency, and a degradation coefficient when interpolation is performed by interpolation calculation based on k of each graph in FIG. 12.
Figure 15:
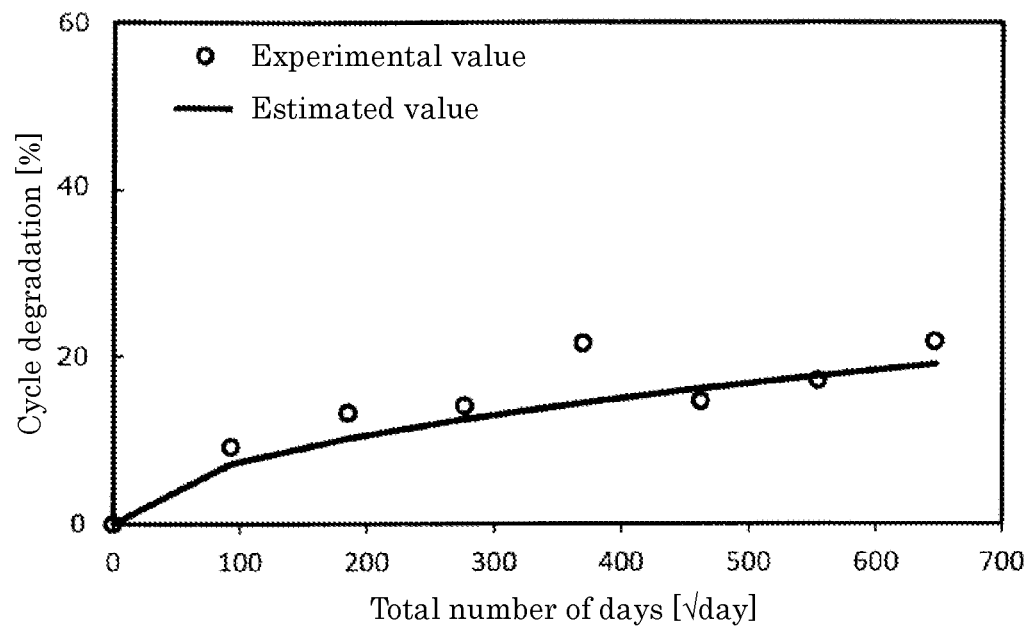
FIG. 15 is a graph illustrating the relationship between an estimated value and a measured value.

FIG. 12 is a graph illustrating the relationship between the number of days and cycle degradation when the SOC is varied by Δ0.5%, Δ1.5%, Δ5%, Δ20%, Δ30%, and Δ100%. In FIG. 12, the horizontal axis represents day [($\sqrt{\text{day}}$)], and the vertical axis represents cycle degradation [%]. The cycle degradation is indicated by a standard value when the largest amount of degradation in FIG. 12 is 100%. Hereinafter, FIGS. 13 to 15 are also based on this standardization. In FIG. 12, graphs when the SOC is varied by Δ0.5%, Δ1.5%, Δ5%, Δ20%, Δ30%, and Δ100% are indicated by a, b, c, d, e, and f.

From the formula (1), k=degradation value/($\sqrt{t}$), and k of each variation range is obtained by optimization calculation or the like based on the curves of a to f.

FIG. 13 is a graph illustrating the relationship among an amplitude spectrum, a frequency, and a degradation coefficient. In FIG. 13, the x-axis represents amplitude spectrum [%], the y-axis represents frequency [Hz], and the z-axis represents degradation coefficient [%/(√day)]. The relationship indicates the frequency and the intensity of the peak top of each waveform of a, b, c, d, and e in FIG. 11 and k of each graph of a, b, c, d, and e obtained from FIG. 12 in association with each other. In FIG. 13, when the amplitude spectrum is about 10.2%, and the amplitude is about $2 \times 10^{-4}$, the degradation coefficient k is about 3.56.

FIG. 14 illustrates the relationship among the amplitude spectrum, the frequency, and the degradation coefficient when interpolation is performed by interpolation calculation based on k of each graph in FIG. 12. In the case of FIG. 14, for a waveform except for the waveforms of a, b, c, d, and e of FIG. 11, k can be obtained by reading a value on the z-axis corresponding to the amplitude spectrum and the frequency of the waveform.

As described above, the control unit 20 weights the waveform of the example of FIG. 11. In FIG. 14, the degradation coefficient k is obtained by reading the value on the z-axis corresponding to the amplitude spectrum and the frequency of the focused waveform obtained by the weighting, that is, reading the z coordinate of the point °. Here, k is 0.75.

FIG. 15 is a graph illustrating the relationship between an estimated value and a measured value. In FIG. 15, the horizontal axis represents the total number of days [days], and the vertical axis represents cycle degradation [%]. The estimated value indicates the relationship between the total number of days and the cycle degradation when k=0.1875 in the formula (1).

The experimental value plots cycle degradation at each time point with respect to the total number of days at a plurality of measurement time points. It was confirmed from FIG. 15 that the estimation can be performed satisfactorily by the estimation method of the present embodiment.

Figure 16:
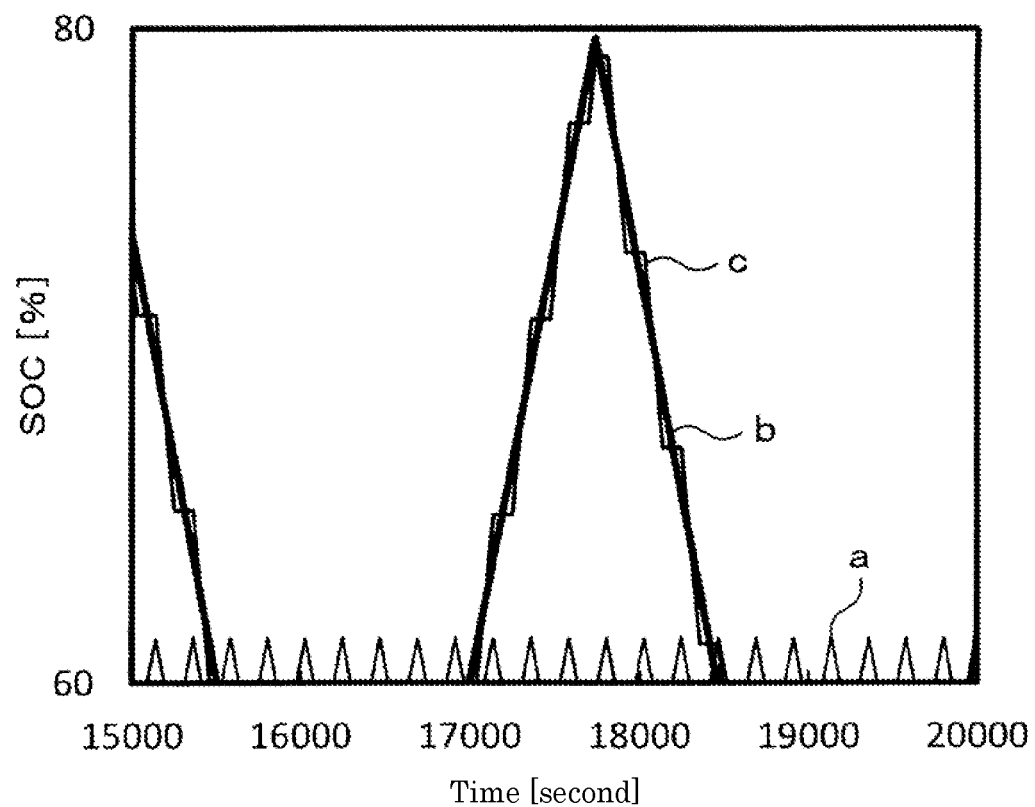
FIG. 16 is a graph illustrating time-series data of the SOC.

According to the estimation method of the embodiment, as illustrated in FIG. 16, even when the charge and discharge are repeated on the high SOC side, and the amplitude of the variation in the SOC is biased to the positive side, the SOC is decomposed into a plurality of waveform components by the Fourier transform, and the degradation coefficient k is acquired, so that the degradation value can be estimated satisfactorily.

From the above, it has been confirmed that the waveform of the variation in the SOC can be decomposed into waveform components in a plurality of frequency domains, and the degradation of the energy storage device can be accurately estimated based on each waveform component and the degradation coefficient k.

The internal state of the energy storage device can be grasped by estimating the amount of decrease in the amount of electricity that can be reversibly extracted from the energy storage device (a degradation value of capacity). Since the potential of the negative electrode at SOC 100% can be seen, when the energy storage device is a lithium ion secondary battery, the risk of precipitation of metallic lithium in the negative electrode can also be seen. The SOH of the energy storage device including the risk can be monitored. It is also possible to determine how to control the energy storage device.

Second Embodiment

Figure 17:
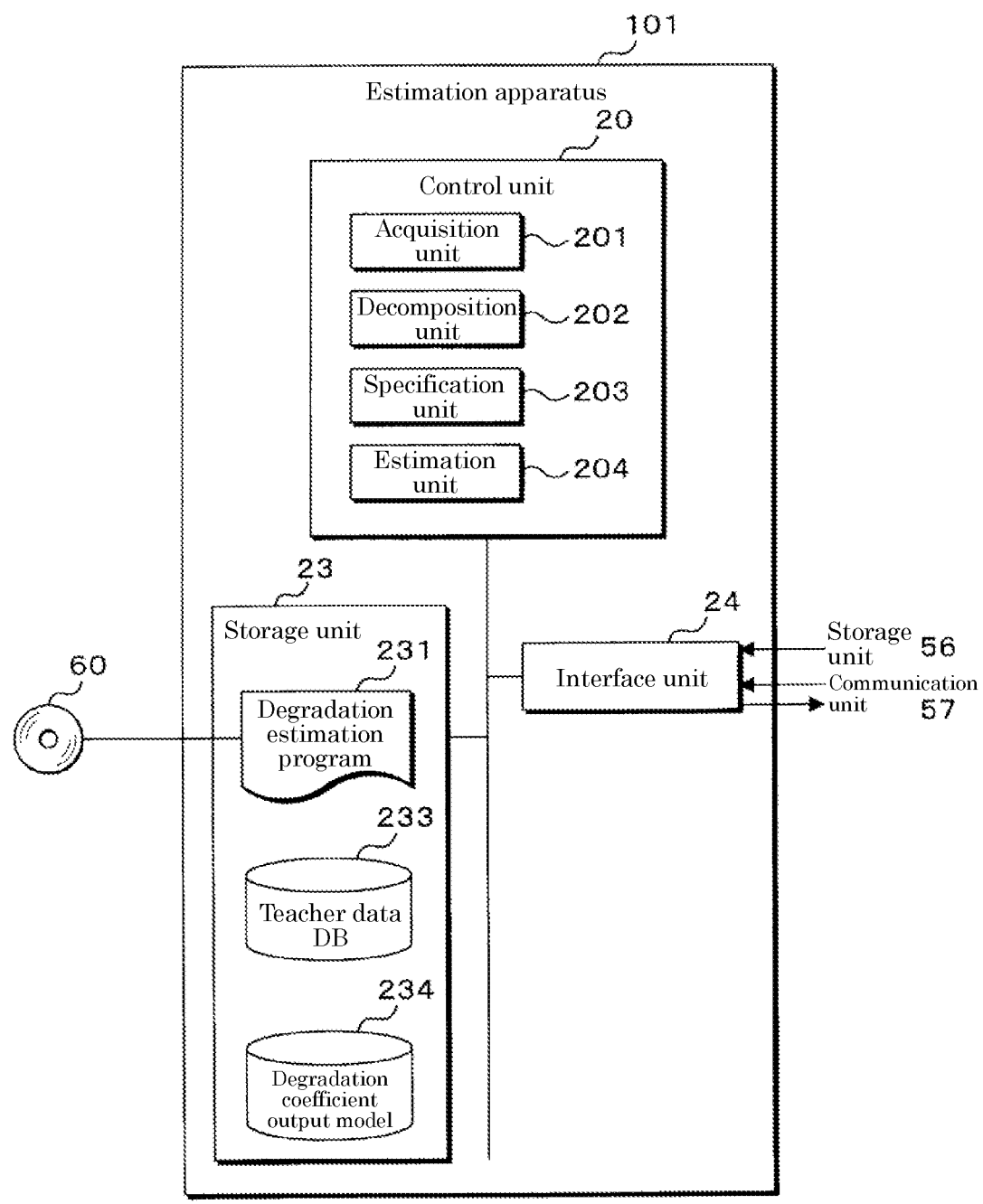
FIG. 17 is a block diagram illustrating a functional configuration of an estimation apparatus according to a second embodiment.

FIG. 17 is a block diagram illustrating an example of the configuration of the estimation apparatus 101 according to a second embodiment. In the drawings, the same portions as those in FIG. 8 are denoted by the same reference numerals, and detailed description thereof is omitted.

The storage unit 23 of the estimation apparatus 101 according to the second embodiment has the same configuration as the estimation apparatus 101 according to the first embodiment except that teacher data DB233 and a degradation coefficient output model 234 are stored.

FIG. 18 is an explanatory diagram illustrating an example of the record layout of the teacher data DB233. The teacher data DB233 stores a large number of pieces of teacher data in order to generate the degradation coefficient output model 234.

The teacher data DB233 stores a No. column, a graph column after Fourier transform, and a degradation coefficient k column. The No. column stores a No. for identifying each teacher data. The graph column after Fourier transform stores a graph after the Fourier transform of the charge-discharge time-series data. The graph is a graph of f(f) obtained by converting ω of f(ω) into f (frequency (Hz)). The degradation coefficient k column stores a degradation coefficient k corresponding to the graph. For example, when the graph of FIG. 11 obtained by performing the Fourier transform on the graph of the example of FIG. 10 is used as teacher data, the degradation coefficient k obtained from the data of the experimental value of FIG. 15 is stored into the degradation coefficient k column.

Figure 19:
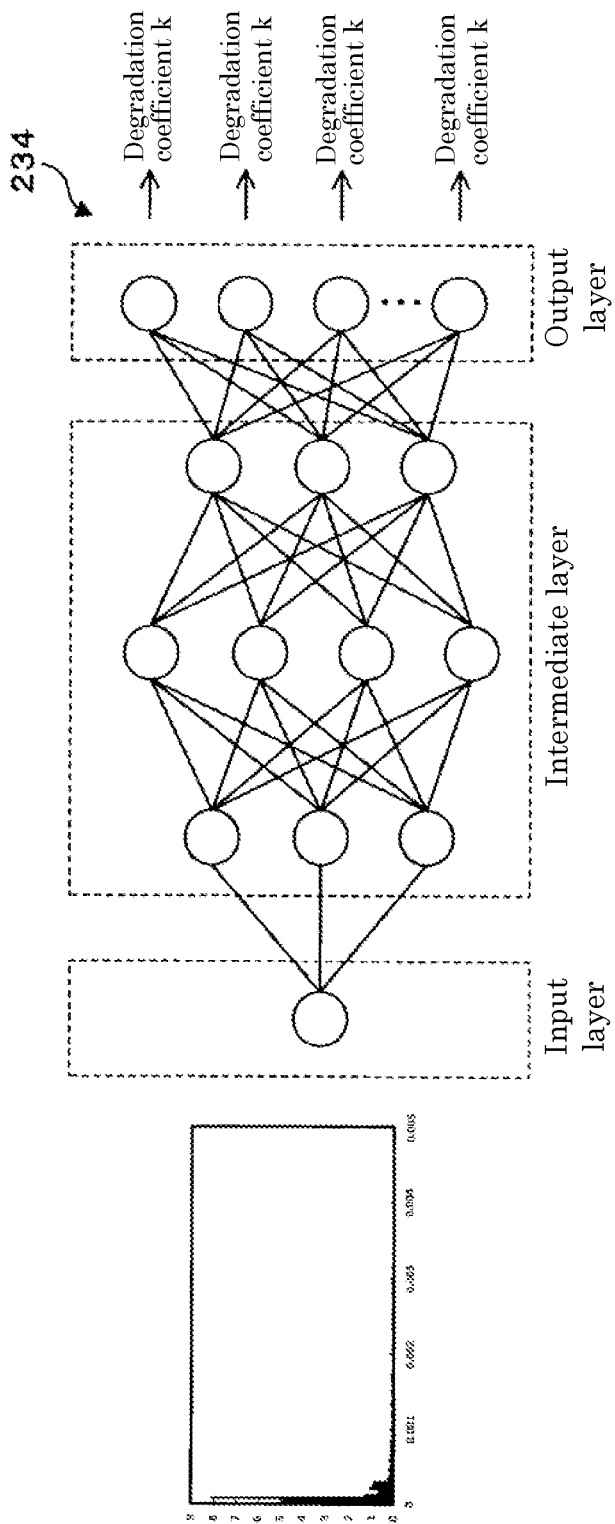
FIG. 19 is a schematic diagram illustrating a configuration of a degradation coefficient output model.

FIG. 19 is a schematic diagram illustrating the configuration of the degradation coefficient output model 234.

The degradation coefficient output model 234 is a learning model assumed to be used as a program module that is a part of artificial intelligence software, and a multilayer neural network (deep learning) can be used. For example, a convolutional neural network (CNN) can be used, but a recurrent neural network (RNN) may be used. Other machine learning may be used, such as a decision tree, a random forest, or a support vector machine. In accordance with a command from the degradation coefficient output model 234, the control unit 20 operates to perform an operation on the graph after the Fourier transform of the charge-discharge time-series data input to the input layer of the degradation coefficient output model 234 and output a probability value of the degradation coefficient k. Details of the degradation coefficient output model 234 will be described below.

The control unit 20 learns a feature amount as the degradation coefficient output model 234 to construct a neural network with the acquired graph f(f) as an input and information indicating the degradation coefficient k as an output. The neural network is a CNN and includes an input layer that receives the input of the graph f(f), an output layer that outputs the probability value of the degradation coefficient k, and an intermediate layer that extracts the feature amount.

In FIG. 19, the number of intermediate layers is 3 but is not limited thereto. For example, when the degradation coefficient output model 234 is a CNN, the intermediate layer has a configuration with a convolution layer and a pooling layer connected alternately and finally extracts the feature amount while compressing information. In FIG. 19, the description of the convolution layer and the pooling layer is omitted. The output layer has a plurality of neurons that each output a specification result of the degradation coefficient k and outputs the plurality of degradation coefficients k and the probability values thereof based on the feature amount output from the intermediate layer. Specifically, the degradation coefficients k output from the neurons are a plurality of degradation coefficients k and the probability values thereof when the softmax function is used.

Although the description has been given assuming that the degradation coefficient output model 234 is a CNN, an RNN can be used as described above. In the RNN, the intermediate layer at the previous time is used for learning together with the input layer at the next time.

The control unit 20 performs learning by using teacher data in which graphs after the Fourier transform of the respective No. in the teacher data DB233 are associated with the degradation coefficients k in the respective graphs.

The control unit 20 inputs the graph of f(f), which is teacher data, into the input layer and acquires the probability value of the degradation coefficient from the output layer through arithmetic processing in the intermediate layer.

The control unit 20 compares the specification result output from the output layer with information labeled with the graph of f(f) in the teacher data, that is, a correct value, and optimizes parameters used for the arithmetic processing in the intermediate layer so that the output value from the output layer approaches the correct value. The parameters are, for example, a weight (coupling coefficient) between the neurons, a coefficient of an activation function used in each neuron, and the like. The parameter optimization method is not particularly limited, but for example, the control unit 20 optimizes various parameters by using backpropagation.

The control unit 20 performs the above processing on the graph of f(f) of each teacher data included in the teacher data DB233 to generate the degradation coefficient output model 234. When acquiring the graph of f(f) obtained by performing the Fourier transform on the charge-discharge time-series data, the control unit 20 acquires the degradation coefficient k indicating a high probability value as the specified degradation coefficient k by using the degradation coefficient output model 234 based on the probability value of the degradation coefficient k output by the degradation coefficient output model 234 and a threshold.

The control unit 20 can cause the degradation coefficient output model 234 to be relearned based on the degradation coefficient k specified by the degradation coefficient output model 234 and the measured degradation coefficient k so as to improve the reliability of the specification result.

Figure 20:
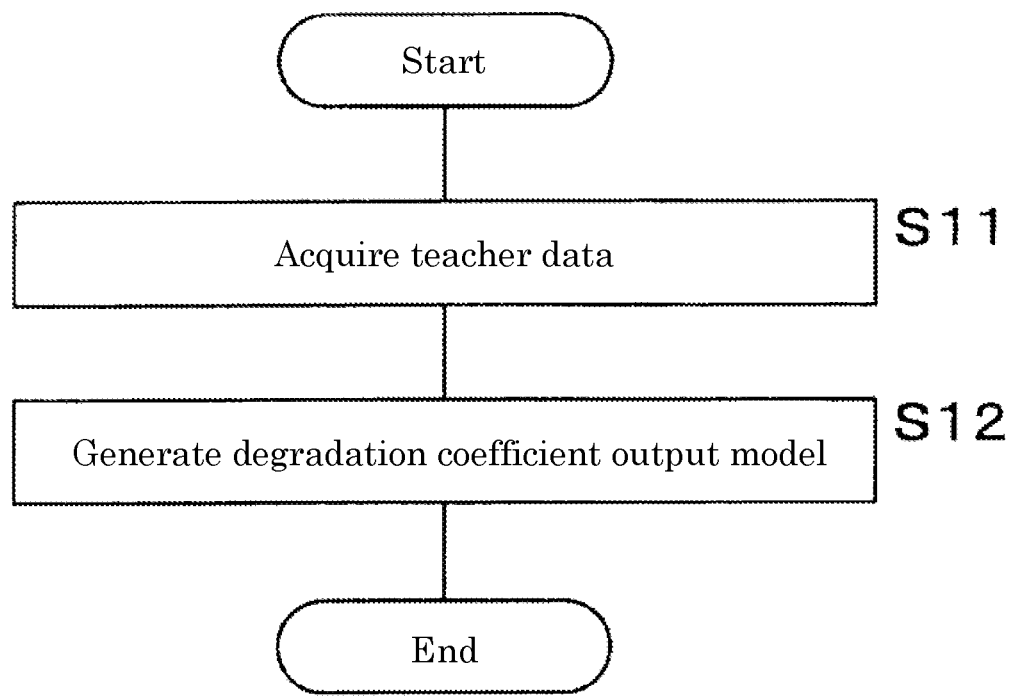
FIG. 20 is a flowchart illustrating an example of a processing procedure for the generation processing of the degradation coefficient output model by a control unit.

FIG. 20 is a flowchart illustrating an example of the processing procedure for the generation processing of the degradation coefficient output model 234 by the control unit 20.

The control unit 20 reads the teacher data DB233 and acquires the teacher data in which the graph after the Fourier transform of each No. is associated with the degradation coefficient (step S11).

The control unit 20 uses the teacher data to generate the degradation coefficient output model 234 that outputs the degradation coefficient k specified when receiving the input of the graph f(f) after the Fourier transform (step S12). The control unit 20 stores the generated degradation coefficient output model 234 into the storage unit 23 and ends a series of processing.

Figure 21:
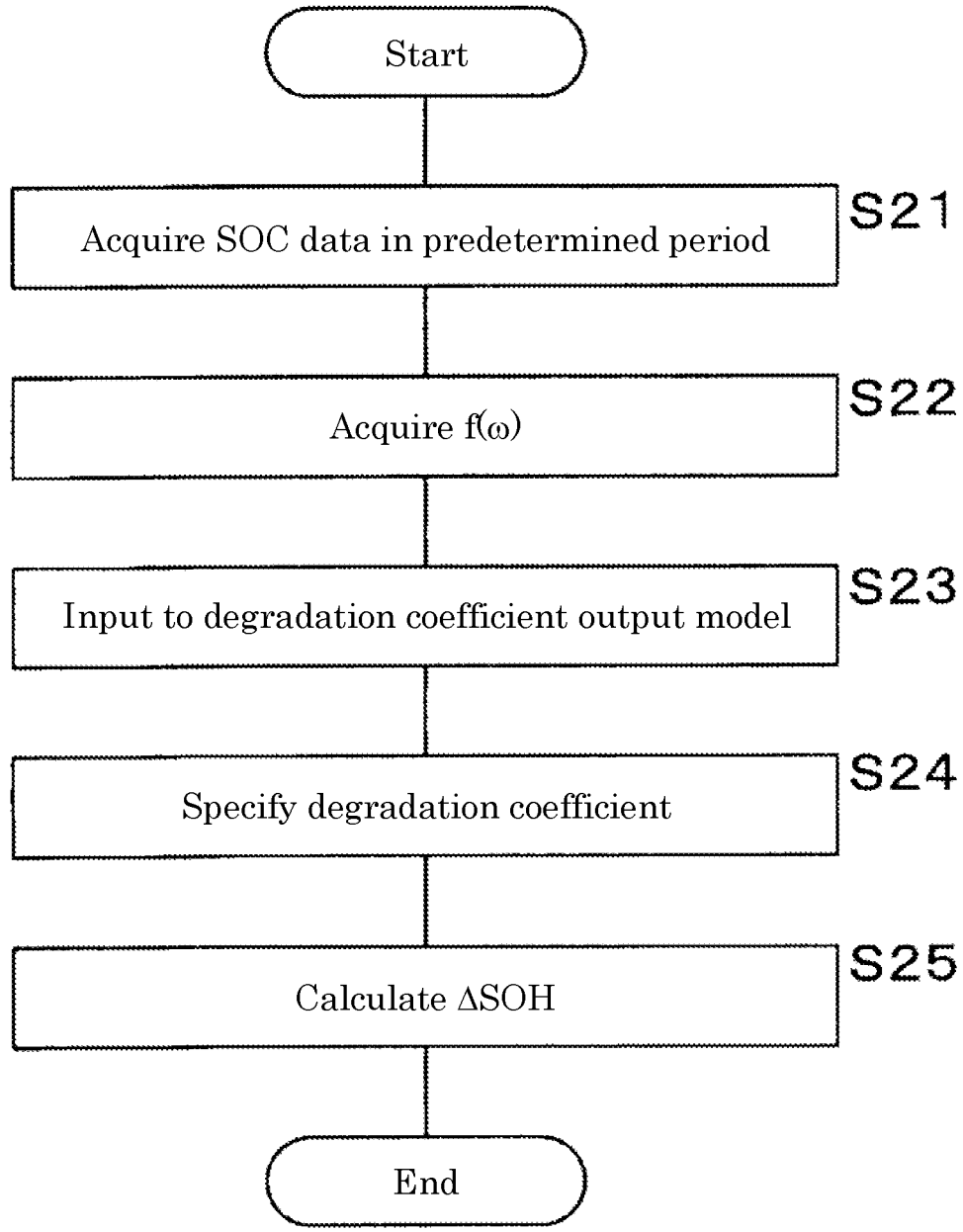
FIG. 21 is a flowchart defining an operation procedure when the estimation apparatus estimates the degradation of the energy storage device.

FIG. 21 is a flowchart defining an operation procedure when the estimation apparatus 101 estimates the degradation of the energy storage device.

First, the control unit 20 acquires variation data of the SOC in a predetermined period (S21).

The control unit 20 performs Fourier transform on the waveform of the variation in the SOC to acquire f($\omega$) and transform f($\omega$) into a function f (f) of the frequency (S22).

The control unit 20 inputs the graph of f(f) to the degradation coefficient output model 234 (S23).

The control unit 20 specifies the degradation coefficient k (S24). Based on the degradation coefficient k and the probability value output from the degradation coefficient output model 234, the control unit 20 sets the degradation coefficient k having a probability value equal to or greater than the threshold as the specified degradation coefficient k.

The control unit 20 calculates $\Delta$SOH by the above formula (1) based on the specified degradation coefficient k (S25) and ends the processing.

According to the present embodiment, it is possible to specify the degradation coefficient in consideration of a waveform component having a small spectral intensity and a large frequency and to satisfactorily estimate the degradation.

Note that a plurality of degradation coefficient output models 234 may be generated in accordance with the center SOC, the temperature, or the like.

In addition, the degradation coefficient output model may be configured to receive an input of charge-discharge time-series data instead of the graph of f(f) and output the degradation coefficient k.

In the first and second embodiments, the estimation apparatus 101 has used the SOC time-series data, but the SOC time-series data may be $\Delta$SOC obtained by a current integration method or the like or may be data obtained by adding/subtracting $\Delta$SOC to/from an SOC initial value.

In the estimation apparatus 101, the estimation unit 204 has calculated the degradation value as the degradation estimation of the energy storage device, but the present invention is not limited thereto. The estimation unit 204 may calculate a level indicating the degradation of the energy storage device, the lifetime of the energy storage device, a replacement time for the energy storage device, and the like.

In the estimation apparatus 101, the estimation unit 204 may estimate the degradation of the energy storage device based on the sum of the degradation value obtained by the present embodiment and a non-energization degradation value Qcnd calculated by the method of Japanese Patent No. 6428957.

In the above embodiment, the case has been described where the degradation coefficient k is specified by the waveform of each variation range in a case where the center SOC is 60%, but the present invention is not limited thereto.

The estimation apparatus is not limited to the case where the degradation is estimated using the degradation coefficient output model. The degradation may be estimated using a learning model that outputs the amount of cycle degradation in the acquisition period of the SOC change when receiving the input of the amplitude spectrum diagram (waveform component), the average SOC, the average temperature T, the acquisition period, and the amount of previous cycle degradation. Although the Fourier transform has been described as an example of the frequency transform, other transforms (e.g., wavelet transform, discrete cosine transform, etc.) may be used.

The above embodiment is not restrictive. The scope of the present invention is intended to include all modifications within the meaning and scope equivalent to the claims.

The invention claimed is:

1. An estimation apparatus comprising:
   an acquisition unit that acquires time-series data of a state of charge (SOC) in an energy storage device;
   a decomposition unit that decomposes a waveform of a variation in the SOC in the time-series data into a frequency component; and
   an estimation unit that estimates degradation of the energy storage device based on the frequency component.

2. The estimation apparatus according to claim 1, wherein the acquisition unit acquires time-series data of an SOC in a predetermined period, and the decomposition unit processes a function of a temporal change of a variation in the SOC in the predetermined period.

3. The estimation apparatus according to claim 2, wherein the decomposition unit decomposes the waveform of the variation in the SOC in the time-series data into waveform components in a plurality of frequency domains, and the estimation unit estimates the degradation based on an intensity and a degradation coefficient of each of the waveform components.

4. The estimation apparatus according to claim 3, further comprising a specification unit that specifies a degradation coefficient based on the waveform component, wherein the estimation unit estimates the degradation based on the degradation coefficient specified by the specification unit.

5. The estimation apparatus according to claim 4, wherein the specification unit specifies the degradation coefficient based on a relationship among an intensity, a frequency and a degradation coefficient of a waveform component.

6. The estimation apparatus according to claim 5, wherein the specification unit weights a waveform component having a high intensity as compared to a waveform component having a low intensity and specifies a degradation coefficient.

7. The estimation apparatus according to claim 4, wherein the specification unit weights a waveform component having a high intensity as compared to a waveform component having a low intensity and specifies a degradation coefficient.

8. The estimation apparatus according to claim 4, wherein the specification unit inputs the waveform component acquired by the decomposition unit to a learning model and specifies the degradation coefficient, the learning model outputting a degradation coefficient when receiving an input of a waveform component.

9. The estimation apparatus according to claim 1, wherein the decomposition unit decomposes the waveform of the variation in the SOC in the time-series data into waveform components in a plurality of frequency domains, and the estimation unit estimates the degradation based on an intensity and a degradation coefficient of each of the waveform components.

10. An estimation method, comprising:

acquiring time-series data of a state of charge (SOC) in an energy storage device;

decomposing a waveform of a variation in the SOC in the time-series data into a frequency component; and estimating degradation of the energy storage device based on the frequency component.

11. A computer program product comprising at least one non-transitory computer-readable storage medium having computer-readable code stored therein, the computer-readable program code configured for:

acquiring time-series data of a state of charge (SOC) in an energy storage device, decomposing a waveform of a variation in the SOC in the time-series data into a frequency component, and estimating degradation of the energy storage device based on the frequency component.

* * * * *